(12) United States Patent
Kotani et al.

(10) Patent No.: US 6,271,070 B2
(45) Date of Patent: *Aug. 7, 2001

(54) METHOD OF MANUFACTURING SEMICONDUCTOR DEVICE

(75) Inventors: Naoki Kotani, Hyogo; Keiichiro Shimizu, Nara, both of (JP)

(73) Assignee: Matsushita Electronics Corporation, Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/206,561

(22) Filed: Dec. 8, 1998

(30) Foreign Application Priority Data

Dec. 25, 1997 (JP) .................................................. 9-356693
Dec. 25, 1997 (JP) .................................................. 9-356700

(51) Int. Cl.⁷ .............................................. H01L 21/8238
(52) U.S. Cl. ........................ 438/207; 438/221; 438/234; 438/700
(58) Field of Search .................................. 438/202, 207, 438/218, 221, 234, 235, 236, 700, 526, 689, 353, 309

(56) References Cited

U.S. PATENT DOCUMENTS

| | | | |
|---|---|---|---|
| 4,948,748 | * 8/1990 | Kitahara et al. | 438/405 |
| 5,034,338 | * 7/1991 | Neppl et al. | 438/207 |
| 5,134,082 | * 7/1992 | Kirchgessner | 438/207 |

(List continued on next page.)

FOREIGN PATENT DOCUMENTS

| | | |
|---|---|---|
| 0 724 291A | 7/1996 | (EP) . |
| 60-154638 | 8/1988 | (JP) . |
| 03110856 | 10/1991 | (JP) . |
| 4-44261 | 2/1992 | (JP) . |
| 5-21591 | 1/1993 | (JP) . |
| 5-109880 | 4/1993 | (JP) . |
| 6-053422 | 2/1994 | (JP) . |
| 6-53422 | 2/1994 | (JP) . |

OTHER PUBLICATIONS

Yamaguchi and Yuzuriha; Process Integration and Device Performance of a Submicron BiCMOS with 16–GHz [cut–off frequency] Double Poly–Bipolar Device, IEEE Transactions on Electron Devices, vol. 36, No. 5, May. 1989, pp. 890–896.*

Shahidi et al.; A High Performance BiCMOS Technology Using 0.25 micron CMOS and Double Poly 47 GHz Bipolar, IEEE 1992 Symposium on VLSI Technology Digest of technical Papers, pp. 28–29.*

Grovenor, C.R.M.; Microelectronics Materials, Institute of Physics Publishing, 1989, pp. 189–193 and 199–207.*

(List continued on next page.)

Primary Examiner—John F. Niebling
Assistant Examiner—Christopher Lattin
(74) Attorney, Agent, or Firm—McDermott, Will & Emery

(57) ABSTRACT

On a main surface of a p-type silicon substrate having a bipolar transistor forming region and a MOS transistor forming region, an epitaxial layer is grown and n-type buried layers are formed. After forming a trench penetrating the buried layer, a buried polysilicon layer is formed in the trench. Then, a threshold control layer, a punch-through stopper layer, a channel stopper layer, an n-type well layer and a p-type well layer of each MOSFET are formed. At this point, since the well layer is formed through high energy ion implantation, the n-type buried layer is suppressed from being enlarged, and hence, time required for forming the trench can be shortened. Thus, a practical method of manufacturing a semiconductor device is provided.

14 Claims, 25 Drawing Sheets

U.S. PATENT DOCUMENTS

| | | | |
|---|---|---|---|
| 5,356,821 | * 10/1994 | Naruse et al. | 438/234 |
| 5,405,790 | * 4/1995 | Rahim et al. | 438/202 |
| 5,407,841 | * 4/1995 | Liao et al. | 438/202 |
| 5,498,578 | * 3/1996 | Steele et al. | 438/400 |
| 5,583,348 | * 12/1996 | Sundaram | 257/73 |
| 5,652,153 | * 7/1997 | Beasom | 438/189 |
| 5,693,555 | 12/1997 | Kim et al. . | |
| 5,811,315 | * 9/1998 | Yindeepol et al. | 438/405 |
| 6,071,767 | * 6/2000 | Monkowski et al. | 438/202 |

OTHER PUBLICATIONS

Wolf, S.; Silicon Processing for the VLSI Era vol. 3: The Submicron MOSFET, Sunset Beach, CA, 1995, pp. 183–186.*

Rung, R.D.; Trench Isolation Prospects for Application in CMOS VLSI, IEDM, 1984, pp. 574–577.*

* cited by examiner

METHOD OF MANUFACTURING SEMICONDUCTOR DEVICE

BACKGROUND OF THE INVENTION

The present invention relates to a method of manufacturing a semiconductor device functioning as a Bi-CMOS including a high frequency bipolar transistor and a MOS transistor mounted on a common substrate.

Typical examples of transistors generally used at present include a bipolar transistor comprising an emitter, a base and a collector and a MOS transistor comprising a gate electrode, a gate oxide film and source/drain regions. A bipolar transistor is characterized by being suitably used in an analog device due to its linear amplifying function, and a MOS transistor is characterized by its simple structure and being suitably used in a logic element. Recently, a bipolar transistor is more widely used as a high frequency transistor, and there is a demand for a transistor suitable to a higher frequency. On the other hand, higher integration is required of a MOS transistor.

Furthermore, a semiconductor device using a high frequency bipolar transistor and a MOS transistor is recently required to be more compact. In order to attain compactness of such a semiconductor device, it is effective to build the semiconductor device in one chip with both the transistors mounted on a common substrate. Accordingly, the so-called Bi-CMOS device including a bipolar transistor and a MOS transistor mounted on a common substrate has been proposed.

Now, a conventionally proposed method of manufacturing a Bi-CMOS device will be described with reference to accompanying drawings. FIGS. 16 through 24 are sectional views for showing conventional manufacturing procedures for the Bi-CMOS device.

First, in the procedure shown in FIG. 16, a main surface of a p-type silicon substrate 101 is oxidized, thereby forming a silicon oxide film thereon. The silicon oxide film is then etched by using a photoresist film (not shown) formed by the lithography on the silicon oxide film as a mask, so as to selectively remove the silicon oxide film. Thus, a mask oxide film 106 having an opening in a bipolar transistor forming region Rbp and an opening in a MOS transistor forming region Rmos is formed.

Next, by using the mask oxide film 106 as a mask, arsenic ions 107 are implanted into the main surface of the p-type silicon substrate 101 under conditions of, for example, at an acceleration energy of 30 keV and a dose of $1.5 \times 10^{15}$ cm. Thus, deep ion implanted layers 102 and 103 are formed respectively in the bipolar transistor forming region Rbp and the MOS transistor forming region Rmos.

Then, a heating treatment is conducted so that the arsenic in the deep ion implanted layers 102 and 103 can be diffused and the deep ion implanted layers 102 and 103 can be oxidized for forming a step for patterning. The mask oxide film 106 is then entirely removed.

Next, in the procedure shown in FIG. 17, an epitaxial layer 105 is grown on the entire main surface of the p-type silicon substrate 101. At this point, the arsenic is partially diffused from the deep ion implanted layers 102 and 103 formed along the main surface of the p-type silicon substrate 101 into the epitaxial layer 105, thereby forming n-type buried layers 108 and 109.

Then, a silicon oxide film 110 and an active region forming silicon nitride film 111 are successively formed on the epitaxial layer 105. Thereafter, openings are formed in the active region forming silicon nitride film 111 correspondingly to the bipolar transistor forming region Rbp and a PMOSFET forming region Rpmos in the MOS transistor forming region Rmos. Phosphorus ions 112 are implanted through these openings, thereby forming surface diffusion layers 113 in the bipolar transistor forming region Rbp and the PMOSFET forming region Rpmos.

Next, in the procedure shown in FIG. 18, the silicon oxide film 110 is removed, and a silicon region in each opening is selectively oxidized, thereby forming a mask oxide film 115. Through the heat treatment for this oxidation, the impurity in the surface diffusion layer 113 is widely diffused, and hence, an n-type well region 114 is formed and the n-type buried layers 108 and 109 are enlarged in their depths.

Subsequently, in the procedure shown in FIG. 19, boron ions 116 are implanted into an NMOSFET forming region Rnmos in the MOS transistor forming region Rmos and the like by using the mask oxide film 115 as a mask, thereby forming a p-type implanted layer.

Then, in the procedure shown in FIG. 20, the mask oxide film 115 is removed and drive-in is conducted through a heat treatment, thereby forming a p-type well region 117. Through this heat treatment, the N-type buried layers 108 and 109 are further enlarged in their depths.

Next, in the procedure shown in FIG. 21, after forming a LOCOS forming silicon nitride film 118 on the substrate, isolation oxide films 119a through 119e are formed in predetermined isolation regions by the general LOCOS method.

Then, in the procedure shown in FIG. 22, after growing a silicon oxide film 120 on the substrate, the isolation oxide films 119a and 119c including portions directly above the edges of the n-type buried layer 109 in the bipolar transistor forming region Rbp and substantially the center portions of the silicon oxide film 120 above the isolation oxide films 119a and 119c are selectively removed. Thus, trench openings 121 are formed.

Subsequently, in the procedure shown in FIG. 23, the silicon substrate exposed within each trench opening 121 is etched by using the silicon oxide film 120 as a mask, thereby forming a trench 122 with a depth of approximately 5 through 6 μm.

Furthermore, in the procedure shown in FIG. 24, after forming a channel stopper layer 123 below the bottom of each trench 122, a sidewall oxide film 124 of the trench 122 is formed. Then, the trench 122 is buried with polysilicon, thereby forming a buried polysilicon layer 125. The buried polysilicon layer 125 is formed by depositing a polysilicon layer on the substrate and etching back the polysilicon film through the dry etching.

The procedures thereafter are not described in detail, through which diffusion layers, electrodes and the like of a bipolar transistor, a PMOSFET and an NMOSFET are formed.

The Bi-CMOS device manufactured in the aforementioned manner can exhibit the following effects because it adopts a trench isolation structure instead of a LOCOS isolation structure: Due to the trench isolation structure, the junction capacitance between a collector in the bipolar transistor forming region Rbp and the substrate can be decreased, resulting in making the bipolar transistor applicable to a higher frequency. Also, since the trench isolation structure is adopted instead of the LOCOS isolation structure, the width of the isolation oxide films 119a through 119e can be decreased as compared with that of PN junction isolation. As a result, the line capacitance can be decreased and the device is applicable to a further higher frequency.

In forming the isolation, the trench is buried not with a silicon oxide film, which is used in a trench structure in a MOS transistor, but with polysilicon. This is for the following reasons: First, since it is necessary to conduct a heat treatment at a high temperature of approximately 900° C. after forming the trench isolation in manufacturing a bipolar transistor, occurrence of defects in the active region derived from a difference in the coefficient of thermal expansion between the silicon substrate and the material within the trench is thus avoided. Secondly, polysilicon in a small grain size having directivity is good in a burying characteristic such as coverage in a groove much deeper than a trench isolation of a MOS transistor, and hence, occurrence of voids unavoidable in using a silicon oxide film can be thus avoided. Accordingly, the trench is buried with polysilicon, and the sidewall oxide film 124 is formed between the buried polysilicon layer 125 and the p-type silicon substrate 101.

Thereafter, although not shown in the drawings, a region directly below the exposed surface of the buried polysilicon layer 125 is oxidized, thereby forming a cap oxide film integrated with the isolation oxide films 119*a* and 119*c*. In this manner, it is possible to prevent formation of an unwanted transistor and occurrence of an unwanted capacitance otherwise caused by the buried polysilicon layer 125 activated by an introduced impurity.

However, the aforementioned conventional method of manufacturing a Bi-CMOS device has the following problems:

First, in the state shown in FIG. 23, the n-type buried layers 108 and 109 are expanded through the heat treatment for forming the n-type well region 114 and the p-type well region 117. Specifically, in forming a high frequency bipolar transistor and a highly integrated CMOS transistor on a common substrate, the heat treatment for activating p-type and n-type wells of the CMOS transistor should be conducted at a high temperature for a long period of time. Therefore, the n-type buried layers 108 and 109 in the bipolar transistor forming region are unavoidably enlarged. Accordingly, in order to guarantee the isolation function, it is necessary to deepen the trench 122 penetrating the n-type buried layer 109 in the bipolar transistor forming region Rbp to a depth of approximately 5 through 6 $\mu$m. This results in disadvantageously excessively increasing the time required for forming the trench 122, and the procedure is practically difficult to conduct.

Since the conventional method of manufacturing a Bi-CMOS device has the aforementioned disadvantage, a Bi-CMOS device including a high frequency bipolar transistor and a CMOS transistor mounted on a common substrate has been difficult to realize.

Also, in removing the silicon oxide film 120 used as a mask in forming the trench in the subsequent procedure, the isolation oxide films 119*b*, 119*d* and 119*e* below the silicon oxide film 120 are also partially removed. This results in degrading the isolation function in the MOS transistor forming region.

Secondly, as is shown in FIG. 24, in the buried polysilicon layer 125 formed by etching back the polysilicon film, the surface can cave in at the center in a V shape as a V groove 126. After forming the buried polysilicon layer 125, an oxide film and a line are formed thereon, and a bridge can be formed and the line can be broken due to this V groove 126.

The present inventors have examined the cause of the formation of this V groove, and have found the following phenomenon as the cause:

As is shown in FIG. 14, in growing the polysilicon film in the trench, pillar-shaped crystal grains are grown in a direction perpendicular to the wall of the trench 122, that is, a direction of temperature gradient. As a result, the tips of the pillar-shaped crystal grains are gathered at the center of the trench 122. Specifically, crystal boundaries are gathered at the center of the trench 122, and a much larger number of defects are present at the center than in other areas. However, in general, the etch rate is much higher in an area including a large number of defects than in an area including a small number of defects. Accordingly, the V groove 126 is formed at the center of the resultant buried polysilicon layer 125.

Such a phenomenon occurs not only in a buried polysilicon layer of a trench in a Bi-CMOS device but also in a buried polysilicon layer in another type of semiconductor device. Also, there is possibility of the occurrence of this phenomenon in etching back another insulating material apart from polysilicon used for burying in a trench.

SUMMARY OF THE INVENTION

A first object of the invention is providing a method of manufacturing a semiconductor device in which a high frequency bipolar transistor and a highly integrated CMOS transistor are formed on a common substrate as one chip without causing the aforementioned conventional problems.

A second object of the invention is providing a method of manufacturing a highly reliable semiconductor device free from line break and a bridge, in which formation of a V groove on the surface of a buried insulating layer formed in a trench is avoided by adjusting the structure of an insulating material such as polysilicon deposited in the trench, so as to attain a uniform etch rate, in order to flatten members formed on the buried polysilicon layer.

In order to achieve the first object, according to the invention, a manufacturing procedure for a MOS transistor is adjusted so that an impurity introduced into a buried layer of a bipolar transistor can be suppressed from diffusing.

The first method of this invention of manufacturing a semiconductor device for forming, on a main surface of a semiconductor substrate, a bipolar transistor operated with a carrier of a first conductivity type used as a majority carrier and a MOS transistor operated with a carrier of a second conductivity type used as a majority carrier, comprises a first step of forming buried layers of the first conductivity type respectively in a bipolar transistor forming region and a MOS transistor forming region; a second step of forming, in a boundary between the bipolar transistor forming region and the MOS transistor forming region, a trench having a depth larger than a lower end of the buried layer of the first conductivity type formed in the bipolar transistor forming region; a third step of burying the trench with a buried film for insulating; a fourth step of forming a well layer of the first conductivity type by implanting, at high energy, an impurity of the first conductivity type into the semiconductor substrate in the MOS transistor forming region; a fifth step of forming a gate electrode, a gate insulating film and source/drain diffusion layers in the MOS transistor forming region; and a sixth step of forming an emitter diffusion layer, a base diffusion layer and a collector diffusion layer in the bipolar transistor forming region.

In this method, since the well layer of the first conductivity type is formed in the MOS transistor forming region by high energy ion implantation, an impurity can be implanted in a desired range reaching the depths of the semiconductor substrate. Specifically, a heat treatment for activating the impurity to be conducted subsequently can be completed in a very short period of time at a low temperature. Therefore, the buried layer of the first conductivity type previously formed in the bipolar transistor forming region can be prevented from being enlarged. Accordingly, there is no need to deepen the trench, and hence, the trench can be formed in a practicable short period of time. Specifically, a Bi-MOS device including a bipolar transistor having a good high frequency characteristic owing to the trench structure can be manufactured through practical procedures.

The first method of manufacturing a semiconductor device can further comprise, prior to the second step, a step of forming, in the boundary between the bipolar transistor forming region and the MOS transistor forming region, an isolation insulating film; a step of forming, on a substrate, a masking film with high etch selectivity to the isolation insulating film and the semiconductor substrate; and a step of forming an opening, including an area directly above an end of the buried layer of the first conductivity type formed in the bipolar transistor forming region, in the masking film and the isolation insulating film directly below the masking film, wherein, in the second step, the trench can be formed by digging a region below the opening in the semiconductor substrate.

In this manner, the trench can be formed without degrading the isolation function of the isolation insulating film, and therefore, a Bi-MOS device suitable to high integration of a MOS transistor can be manufactured.

In this case, the isolation insulating film is preferably a silicon oxide film, and in the second step, the trench is formed preferably by using a silicon nitride film as a mask.

In this manner, even when a silicon nitride film with lower etch selectivity to the semiconductor substrate than a silicon oxide film is used as a masking film, there arises no problem because the trench is shallower and an etching time is shortened than that in a conventional manufacturing method owing to the features of the first method of manufacturing a semiconductor device. Therefore, the isolation insulating film can be prevented from becoming too thin in removing the silicon oxide film used as a masking film to retain the isolation function.

In the first method of manufacturing a semiconductor device, in the first step, each of the buried layers of the first conductivity type can be formed by forming an impurity implanted layer of the first conductivity type in a part of the semiconductor substrate and by forming an epitaxial growth layer on the semiconductor substrate so as to diffuse an impurity of the impurity implanted layer of the first conductivity type into a part of the epitaxial growth layer, and in the fourth step, the well layer of the first conductivity type can be formed in a region including at least the epitaxial growth layer.

In this manner, a bipolar transistor having a good high frequency characteristic can be formed of an epitaxial growth layer with good crystallinity.

In the first method of manufacturing a semiconductor device, the first conductivity type is preferably an n-type and the second conductivity type is preferably a p-type.

In this manner, an NPN bipolar transistor using electrons with high mobility as a majority carrier is formed, resulting in manufacturing a Bi-MOS device having a good high frequency characteristic.

According to this invention, in order to achieve the second object, the crystal structure of a buried film with the pillar-shaped structure of of polycrystal buried in the trench is rearranged, so as to make uniform the distribution of defects and the etch rate.

The second method of manufacturing a semiconductor device of this invention comprises a first step of forming a trench on a main surface of a semiconductor substrate; a second step of depositing a buried film of polycrystal including plural crystal grains on the semiconductor substrate; a third step of conducting a heat treatment for changing the crystal grains of the buried film formed in the second step into large crystal grains; and a fourth step of allowing the buried film to remain in the trench by etching back the buried film.

Since this method includes the third step of conducting the heat treatment with the buried film deposited on the substrate and within the trench, the crystal structure of the buried film within the trench is rearranged through the heat treatment to be changed from the pillar-shaped structure to an indeterminate granular structure. Thus, the distribution of defects can be made substantially uniform. Accordingly, in allowing the buried film to remain within the trench through the etch back by the dry etching in the fourth step, the etch rate on the plane can be made uniform. Thus, a V groove can be definitely prevented from being formed on the top surface of the buried film. Accordingly, without additionally conducting a burying procedure and an oxide film burying procedure, a highly reliable semiconductor device free from line break and a bridge otherwise caused in subsequent procedures can be obtained.

In the second method of manufacturing a semiconductor device, when the method is adopted to form a bipolar transistor operated with a carrier of a first conductivity type used as a majority carrier and a MOS transistor operated with a carrier of a second conductivity type used as a majority carrier on the main surface of the semiconductor substrate, the method preferably further comprises a step of growing buried layers of the first conductivity type respectively in a bipolar transistor forming region and a MOS transistor forming region, and in the first step, the trench is preferably formed, in a boundary between the bipolar transistor forming region and the MOS transistor forming region, in a depth larger than a lower end of the buried layer of the first conductivity type grown in the bipolar transistor forming region.

In this manner, a semiconductor device with a small line capacitance can be obtained because the PN junction area can be reduced owing to the trench structure. Therefore, a Bi-MOS device including a bipolar transistor suitable to a higher frequency can be obtained.

The second method of manufacturing a semiconductor device can further comprises, prior to the first step, a step of forming an isolation insulating film in the boundary between the bipolar transistor forming region and the MOS transistor forming region; a step of forming, on a substrate, a masking film of a material with high etch selectivity to the isolation insulating film and the semiconductor substrate; and a step of forming an opening, including an area directly above an end of the buried layer of the second conductivity type grown in the bipolar transistor forming region, in the making film and the isolation insulating film directly below the masking film, go wherein, in the first step, the trench can be formed by digging a region below the opening in the semiconductor substrate.

In this manner, the trench can be formed without degrading the isolation function of the isolation insulating film. Accordingly, a Bi-MOS device suitable to higher integration of a MOS transistor can be obtained.

In the second method of manufacturing a semiconductor device, the isolation insulating film is preferably a silicon oxide film, and the masking film is preferably a silicon nitride film.

In this manner, since a silicon nitride film with higher etch selectivity to the semiconductor substrate is used as a masking film, the etching can be conducted under a condition where the trench can be formed at high etch rate. Accordingly, the time required for forming the trench can be shortened, and the isolation insulating film can be prevented from being so thin that the isolation function is spoiled.

In the second method of manufacturing a semiconductor device, the first conductivity type is preferably an n-type and the second conductivity type is preferably a p-type.

In this manner, an NPN bipolar transistor using electrons with high mobility as a majority carrier can be formed, resulting in obtaining a Bi-MOS device having a good high frequency characteristic.

In the second method of manufacturing a semiconductor device, the buried film is preferably a polysilicon film.

In this manner, the junction capacitance between the collector and the substrate in the bipolar transistor forming region can be decreased, and hence, a semiconductor device including a bipolar transistor suitable to a higher frequency can be obtained.

In the second method of manufacturing a semiconductor device, the heat treatment conducted on the buried film is preferably performed at a temperature exceeding a growth temperature of a material of the buried film but lower than 1000° C.

In this manner, the crystalline structure of polysilicon within the trench can be rearranged to be changed from the pillar-shaped structure to the granular structure in an indeterminate shape.

DETAILED DESCRIPTION OF THE INVENTION

Embodiment 1

A first embodiment of a method of manufacturing a semiconductor device according to the invention will now be described with reference to the accompanying drawings.

FIGS. 1 through 11 are sectional views for showing procedures in the method of manufacturing a semiconductor device of this embodiment.

Figure 1:
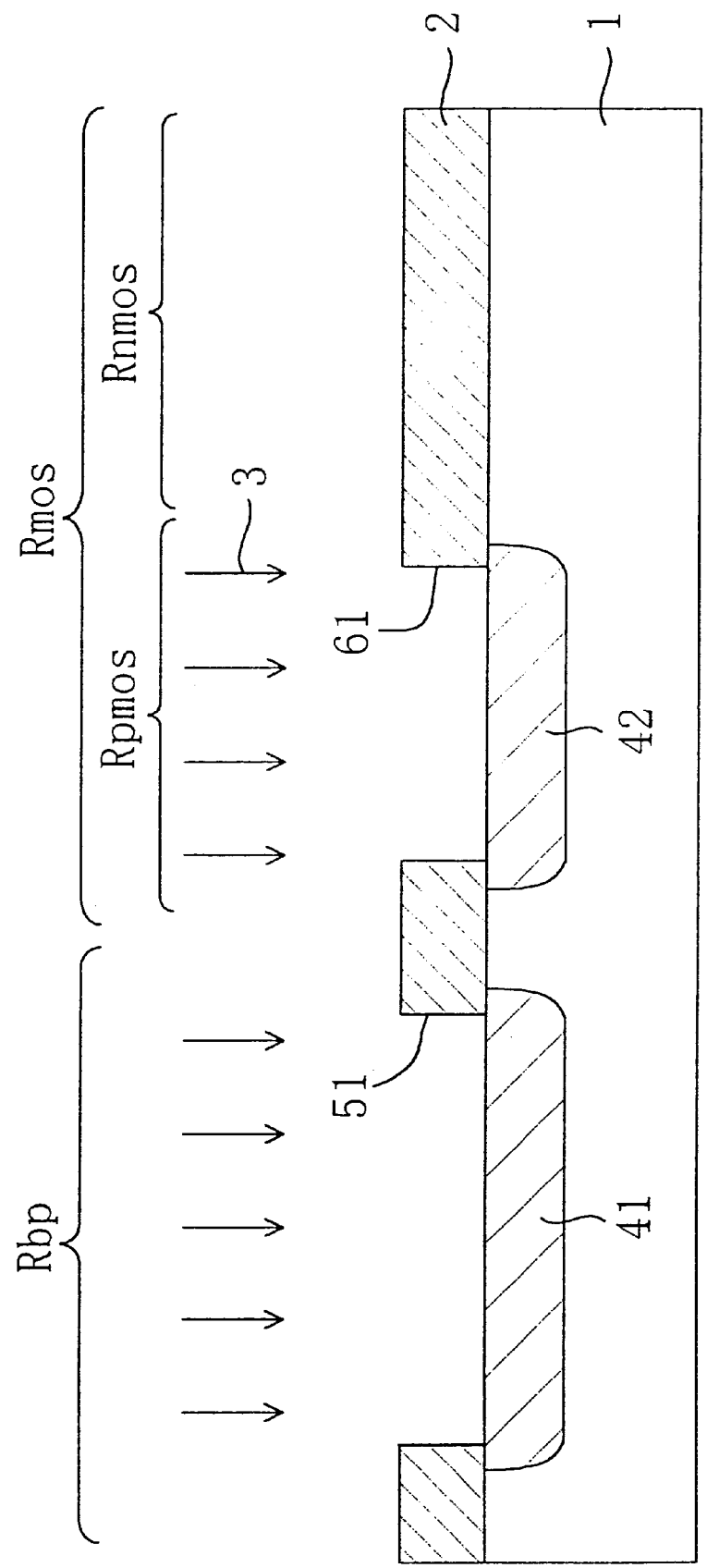
FIG. 1 is a sectional view for showing a procedure for forming a deep ion implanted layer in a method of manufacturing a semiconductor device according to a first embodiment of the invention.

First, in the procedure shown in FIG. 1, a main surface of a p-type silicon substrate 1 is oxidized, thereby forming a silicon oxide film. Then, the silicon oxide film is selectively removed through etching by using a photoresist film (not shown) formed on the silicon oxide film by the lithography as a mask. Thus, a mask oxide film 2 having openings 51 and 61 respectively in a bipolar transistor forming region Rbp and a MOS transistor forming region Rmos is formed.

Then, by using the mask oxide film 2 as a mask, arsenic ions 3 are implanted into the main surface of the p-type silicon substrate 1 under conditions of, for example, an acceleration energy of 30 keV and a dose of $1.5\times10^{15}$ $cm^2$. In this manner, deep ion implanted layers 41 and 42 are formed in the bipolar transistor forming region Rbp and the MOS transistor forming region Rmos, respectively.

Thereafter, a heat treatment is conducted so that the arsenic in the deep ion implanted layers 41 and 42 can be diffused and the deep ion implanted layers 41 and 42 can be oxidized for forming a step for patterning. Then, the entire mask oxide film 2 is removed.

Figure 2:
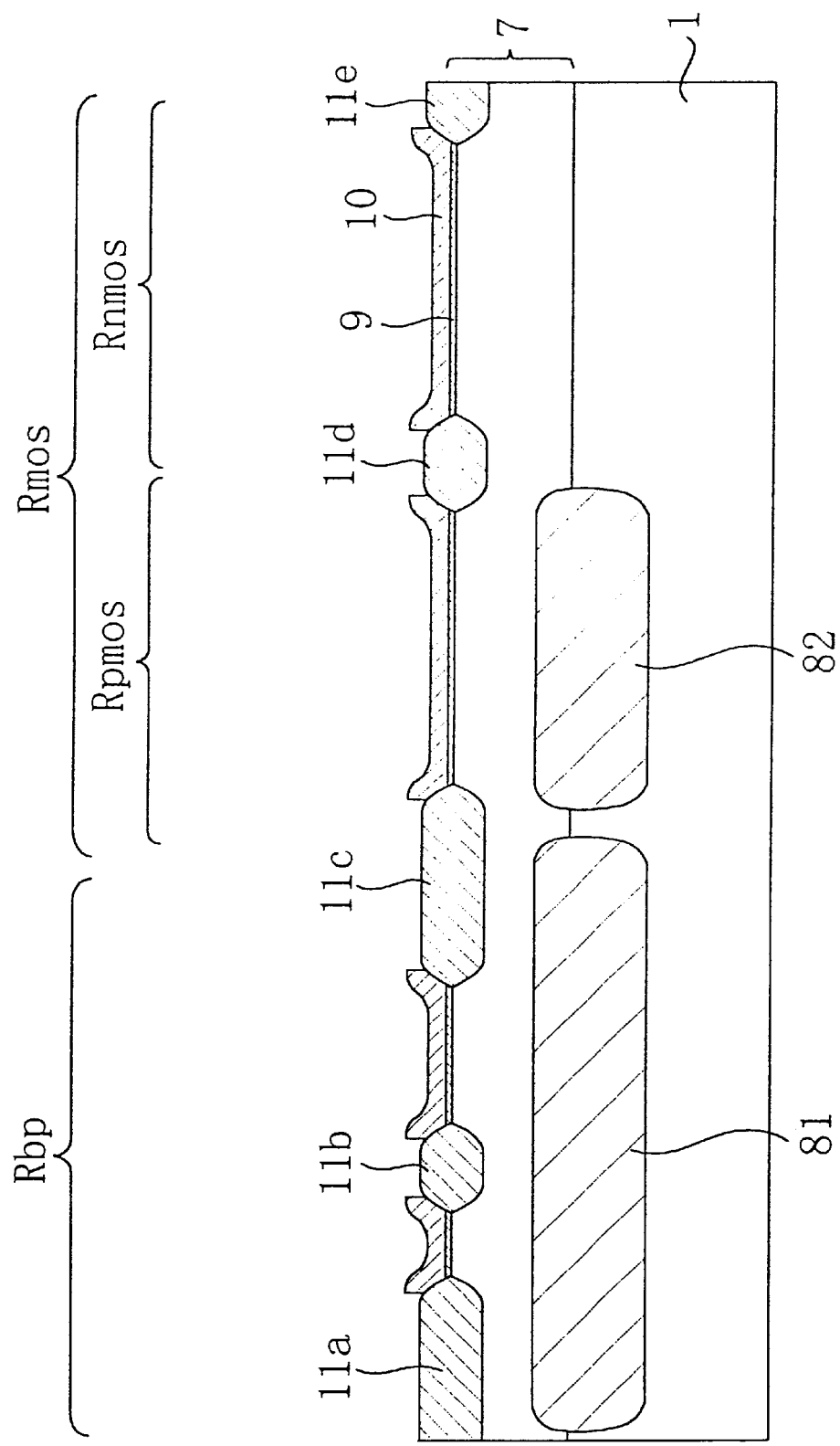
FIG. 2 is a sectional view for showing a procedure for forming an isolation oxide film in the method of manufacturing a semiconductor device of the first embodiment.

Next, in the procedure shown in FIG. 2, an n-type epitaxial layer 7 is grown on the entire main surface of the p-type silicon substrate 1. At this point, the arsenic included in the deep ion implanted layers 41 and 42 formed along the main surface of the p-type silicon substrate 1 is partially diffused into the epitaxial layer 7, resulting in forming n-type buried layers 81 and 82 each with a large width and a large depth. It is noted that the epitaxial growth is conducted so as not to allow the n-type buried layer 81 in the bipolar transistor forming region Rbp and the n-type buried layer 82 in the MOS transistor forming region Rmos to come in contact with each other. As a result, the n-type buried layer 81 is formed in a wide region extending over the entire bipolar transistor forming region Rbp, and the n-type buried layer 82 is formed in a PMOSFET forming region Rpmos alone in the MOS transistor forming region Rmos.

Then, after successively forming a silicon oxide film 9 and a first silicon nitride film 10 on the epitaxial layer 7, isolation oxide films 11a through 11e are formed in predetermined isolation regions by the general LOCOS method. At this point, the isolation oxide film 11a is formed above an area including one edge and the outer region of the n-type buried layer 81 in the bipolar transistor forming region Rbp, the isolation oxide film 11b is formed above substantially the center of the n-type buried layer 81, and the isolation oxide film 11c is formed above an area including the other edge and the outer region of the n-type buried layer 81. Also, the isolation oxide film 11d is formed above the edge of the n-type buried layer 82 substantially at the center of the MOS transistor forming region Rmos, and the isolation oxide film 11e is formed above the MOS transistor forming region Rmos and the outer region.

Figure 3:
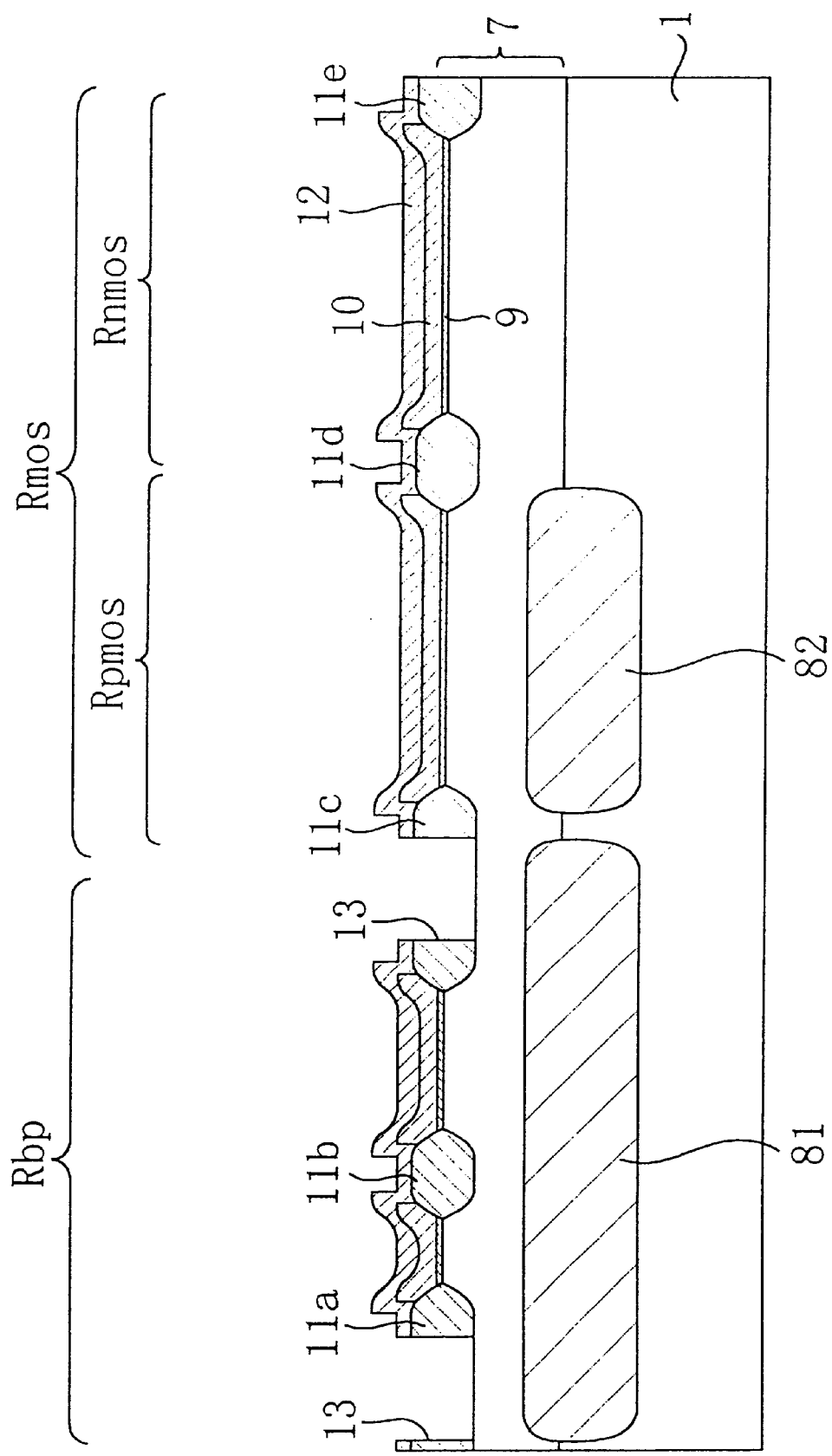
FIG. 3 is a sectional view for showing a procedure for forming a mask oxide film and a trench opening in the method of manufacturing a semiconductor device of the first embodiment.

Next, in the procedure shown in FIG. 3, after forming a second silicon nitride film 12 used as a masking film on the substrate, the isolation oxide films 11a and 11c and the substantially center portions of the second silicon nitride film 12 above the isolation oxide films 11a and 11c are selectively removed by the lithography and the dry etching. Thus, trench openings 13 are formed in these etched areas. These trench openings 13 define the edges of the bipolar transistor forming region Rbp, and are formed above the edges of the n-type buried layer 81 in the bipolar transistor forming region Rbp.

Figure 4:
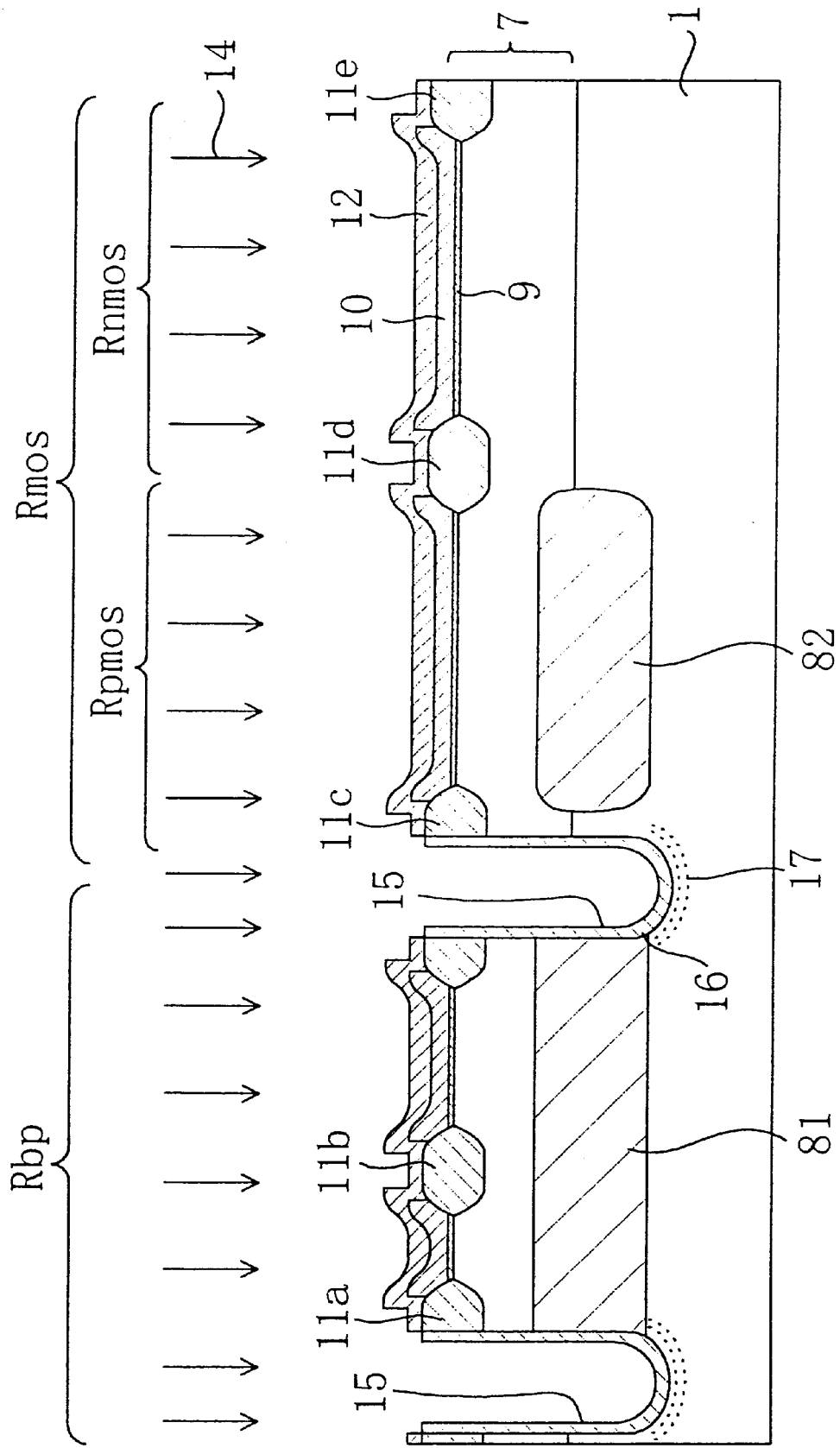
FIG. 4 is a sectional view for showing a procedure for forming a trench, a channel stopper layer and a trench sidewall oxide film in the method of manufacturing a semiconductor device of the first embodiment.

Next, in the procedure shown in FIG. 4, by using the second silicon nitride film 12 as a mask, the silicon substrate exposed within each trench opening 13 is etched, thereby forming a trench 15 with a depth of approximately 3 $\mu$m. Furthermore, by using the second silicon nitride film 12 as a mask, boron ions 14 are implanted under conditions of, for example, an acceleration energy of 30 keV and a dose of $1.0\times10^{12}$ $cm^2$, thereby forming a channel stopper layer 17. Thereafter, the substrate surface exposed within each trench 15 is oxidized, thereby forming a trench sidewall oxide film 16.

Figure 5:
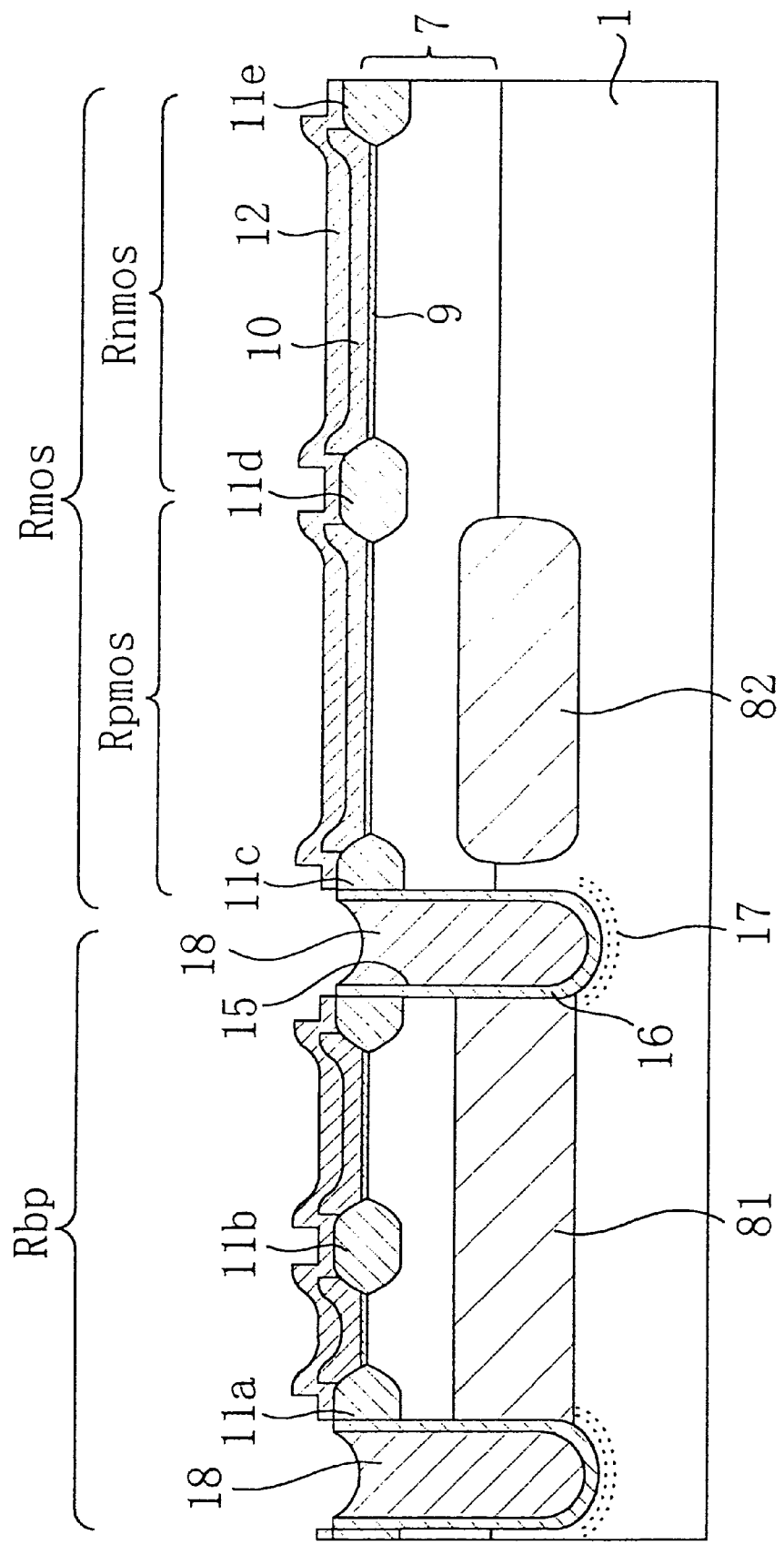
FIG. 5 is a sectional view for showing a procedure for forming a buried polysilicon layer in the trench in the method of manufacturing a semiconductor device of the first embodiment.

Next, in the procedure shown in FIG. 5, after depositing a polysilicon film to be used as a buried film with polycrystal structure on the substrate, the polysilicon film is etched back through the dry etching by using the second silicon nitride film 12 as an etching stopper film. Thus, a buried polysilicon layer 18 is formed in each trench 15.

Figure 6:
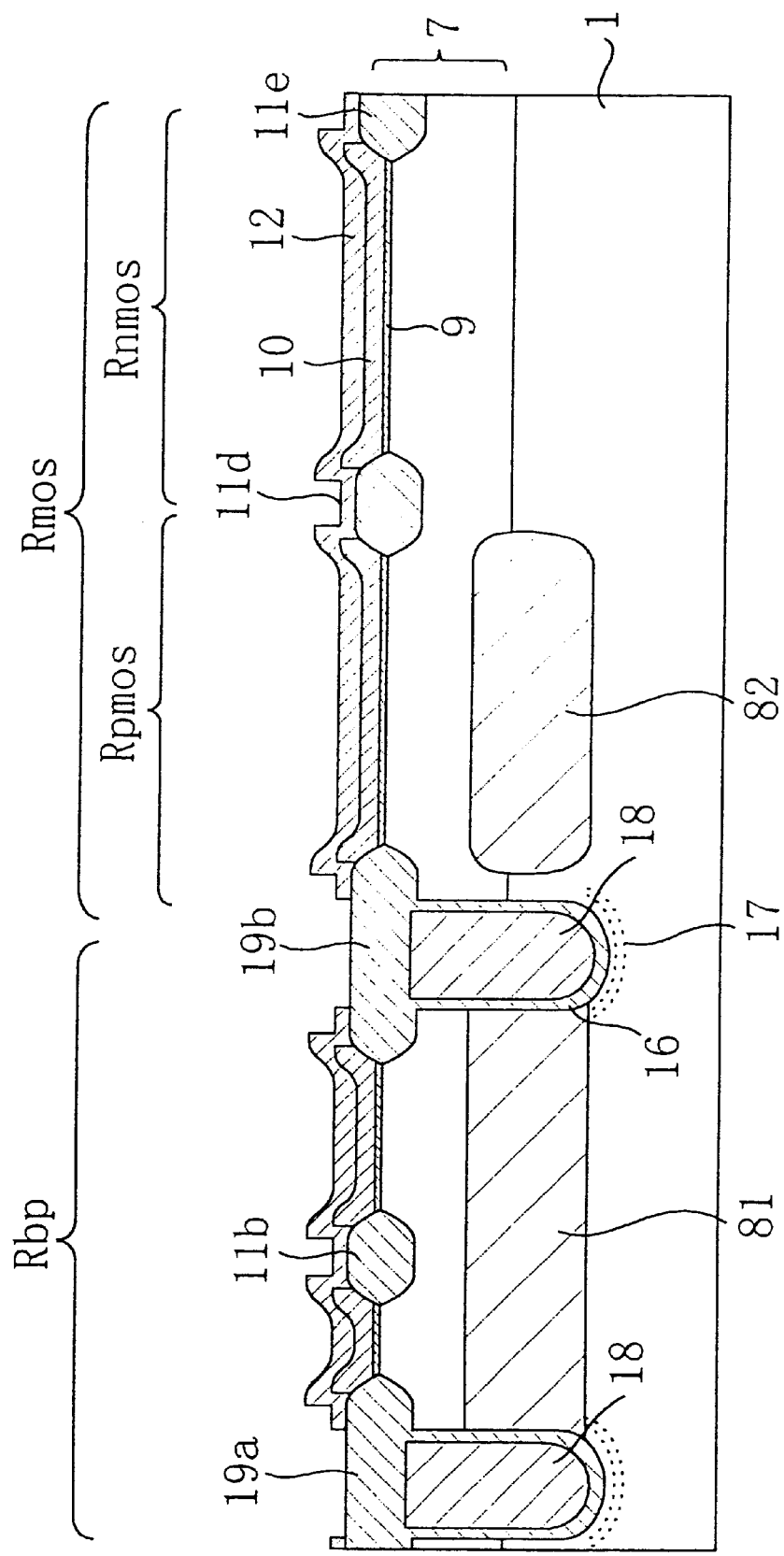
FIG. 6 is a sectional view for showing a procedure for forming a cap oxide film on the trench in the method of manufacturing a semiconductor device of the first embodiment.

Then, in the procedure shown in FIG. 6, by using the second silicon nitride film 12 as a mask, a region directly below the exposed surface of the buried polysilicon layer 18 is oxidized, thereby forming cap oxide films 19a and 19b integrated with the isolation oxide films 11a and 11c, respectively.

Figure 7:
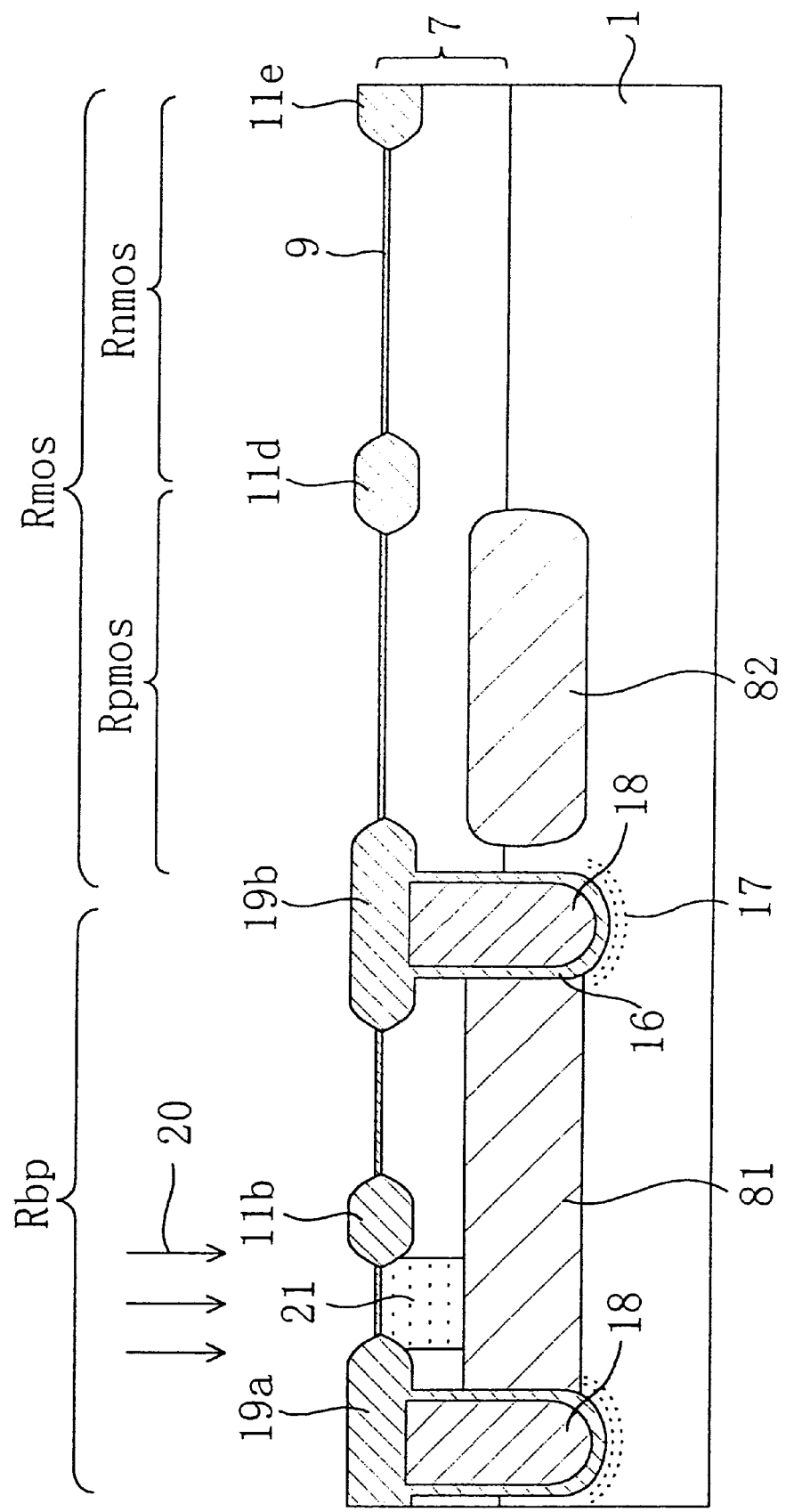
FIG. 7 is a sectional view for showing a procedure for forming a collector wall in the method of manufacturing a semiconductor device of the first embodiment.

Next, in the procedure shown in FIG. 7, after removing the first silicon nitride film 10 and the second silicon nitride film 12, a photoresist film (not shown) having an opening corresponding to a predetermined region for forming a collector in the bipolar transistor forming region Rbp is formed by the lithography. By using the photoresist film as a mask, phosphorus ions 20 are implanted under conditions of, for example, an acceleration energy of 60 keV and a dose of $3.0\times10^{15}$ $cm^2$. Thus, a collector wall 21 is formed.

Through a series of procedures shown in FIGS. 1 through 7, the trench isolation structure is obtained. Therefore, the junction capacitance between the collector and the substrate in the bipolar transistor forming region Rpb can be decreased, and the resultant bipolar transistor can attain a high frequency characteristic. Furthermore, since the width of the isolation oxide films 11a through 11e can be smaller than that of the PN junction isolation, the line capacitance can be decreased, resulting in attaining a further higher frequency characteristic.

Figure 8:
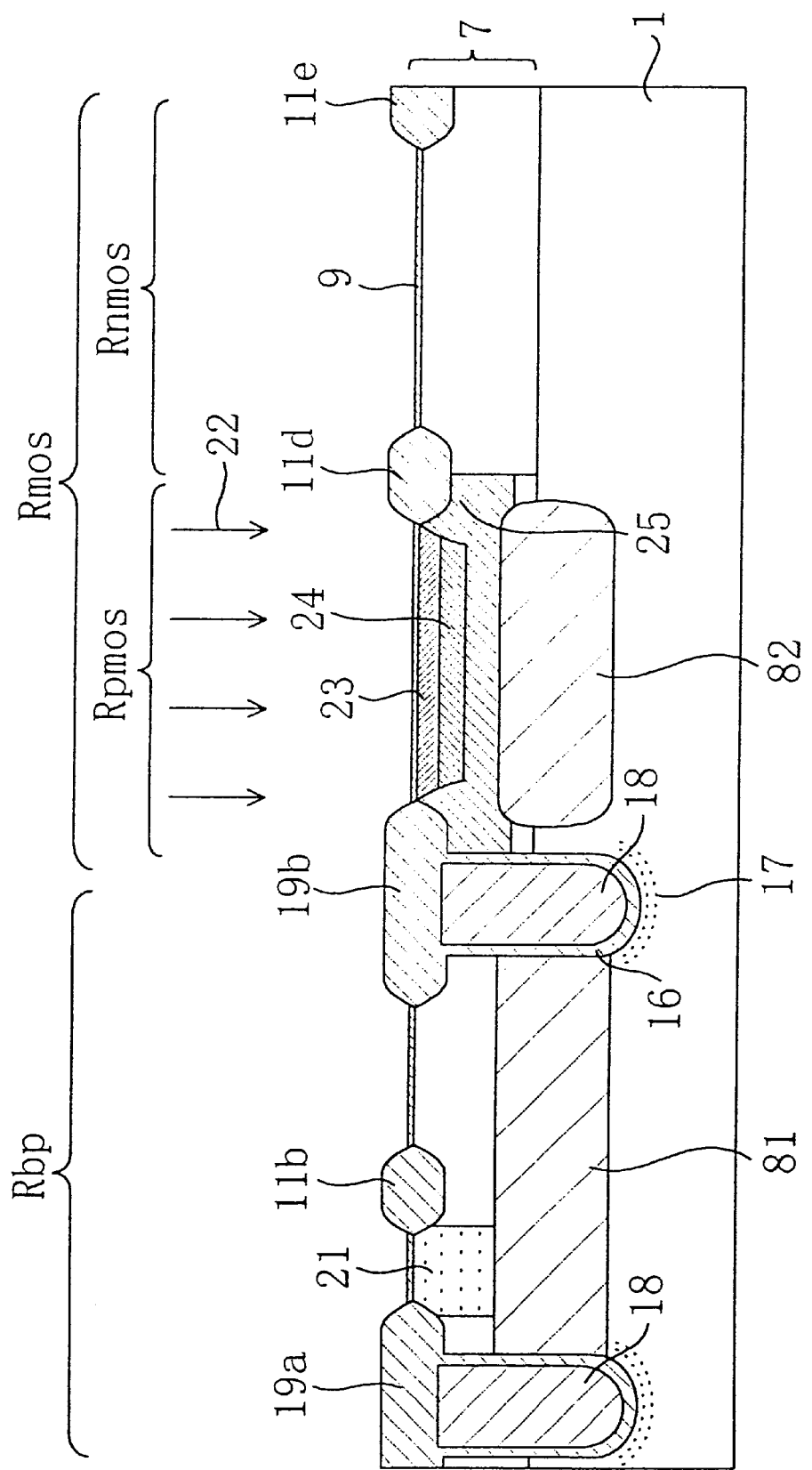
FIG. 8 is a sectional view for showing a procedure for forming a channel stopper layer of a PMOSFET in the method of manufacturing a semiconductor device of the first embodiment.

Subsequently, in the procedure shown in FIG. 8, a photoresist film (not shown) having an opening corresponding to the PMOSFET forming region Rpmos in the MOS transistor forming region Rmos is formed by the lithography. By using the photoresist film as a mask, boron ions are implanted under conditions of, for example, an acceleration energy of 15 keV and a dose of $6.3\times10^{12}$ $cm^2$, thereby forming a threshold control layer 23 of a PMOSFET. Furthermore, also by using the photoresist film as a mask, phosphorus ions 22 are implanted through high energy ion implantation under conditions of, for example, an acceleration energy of 160 keV and a dose of $6.6\times10^{12}$ $cm^2$. Thus, a punch-through stopper layer 24 is formed below the threshold control layer 23. Moreover, also by using the photoresist film as a mask, phosphorus ions 22 are implanted under conditions of, for example, an acceleration energy of 350 keV and a dose of $7.0\times10^{12}$ $cm^2$. Thus, a channel stopper layer 25 is formed in a region extending from a portion directly below the mask oxide film 19b to a portion below the isolation oxide film 11d.

Figure 9:
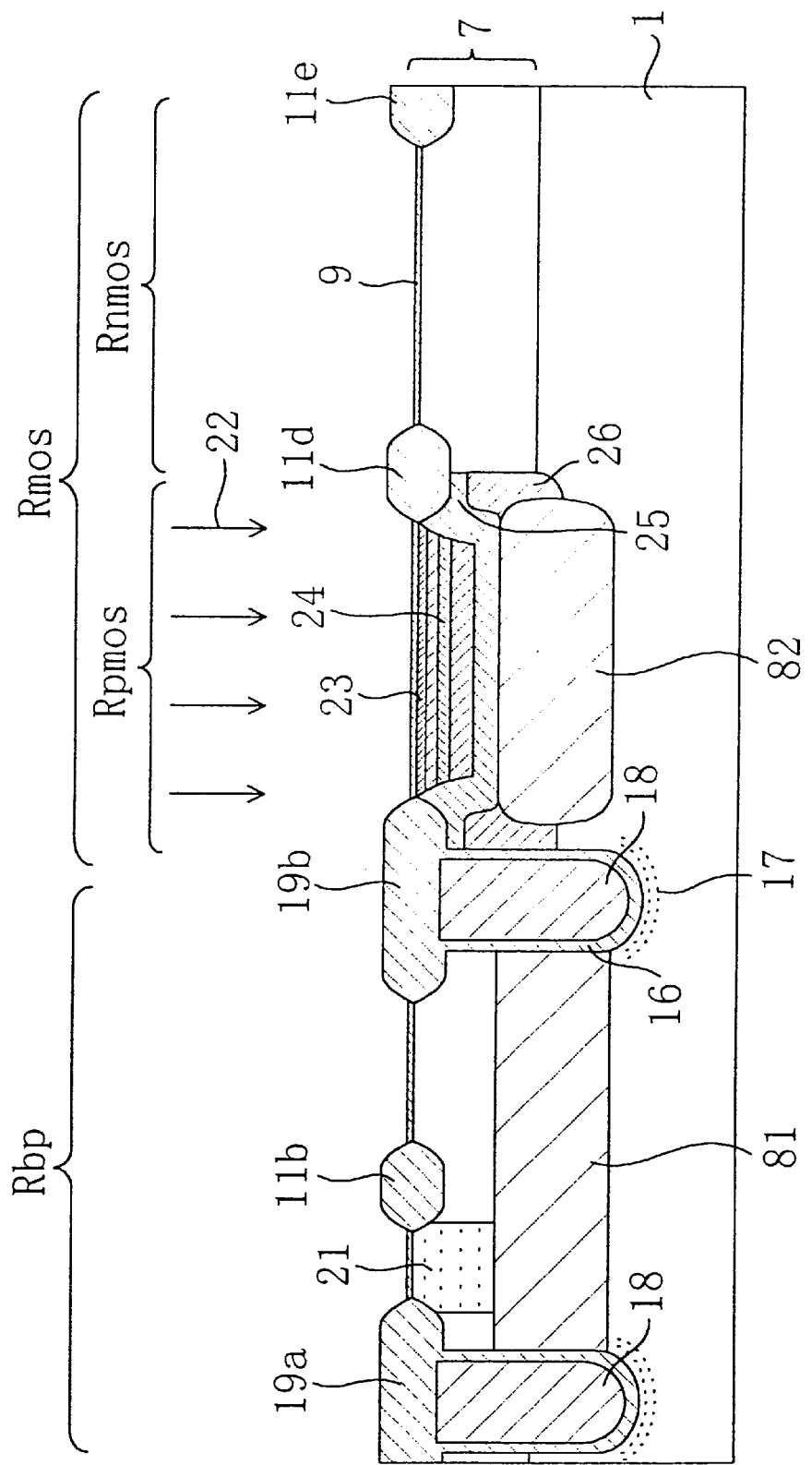
FIG. 9 is a sectional view for showing a procedure for forming an n-type well layer of the PMOSFET in the method of manufacturing a semiconductor device of the first embodiment.

Then, in the procedure shown in FIG. 9, by using the same photoresist film as a mask, phosphorus ions 22 are implanted under conditions of, for example, an acceleration energy of 700 keV and a dose of $1.0 \times 10^{13}$ cm². Thus, an n-type well layer 26 is formed in a wide region extending from a portion directly below the threshold control layer 23 to a portion below the channel stopper layer 25.

Figure 10:
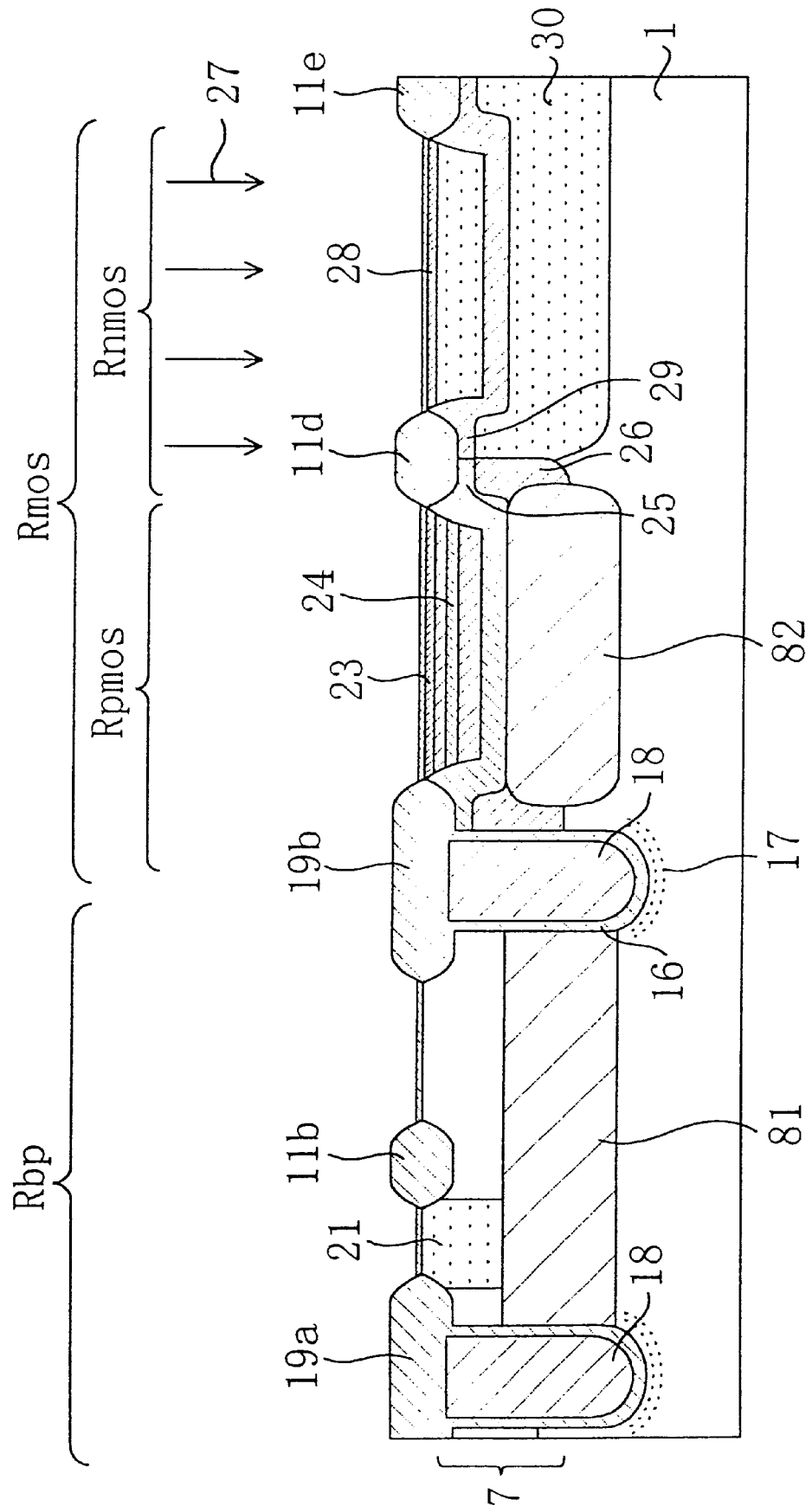
FIG. 10 is a sectional view for showing a procedure for forming a p-type well layer of an NMOSFET in the method of manufacturing a semiconductor device of the first embodiment.

Next, in the procedure shown in FIG. 10, a photoresist film (not shown) having an opening corresponding to an NMOSFET forming region Rnmos alone in the MOS transistor forming region Rmos is formed by the lithography. By using the photoresist film as a mask, phosphorus ions (not shown) are implanted under conditions of, for example, an acceleration energy of 30 keV and a dose of $4.6 \times 10^{12}$ cm², thereby forming a threshold control layer 28 of an NMOSFET. Furthermore, also by using the photoresist film as a mask, boron ions 27 are implanted through the high energy ion implantation under conditions of, for example, an acceleration energy of 180 keV and a dose of $7.0 \times 10^{12}$ cm². Thus, a channel stopper layer 29 is formed in a region extending from a portion directly below the isolation oxide film 11d to a portion directly below the isolation oxide film 11e. Thereafter, by using the same photoresist film as a mask, boron ions 27 are implanted under conditions of, for example, an acceleration energy of 400 keV and a dose of $4.4 \times 10^{12}$ cm². Thus, a p-type well layer 30 is formed in a widely extending region below the threshold control layer 28 and the channel stopper layer 29.

Figure 11:
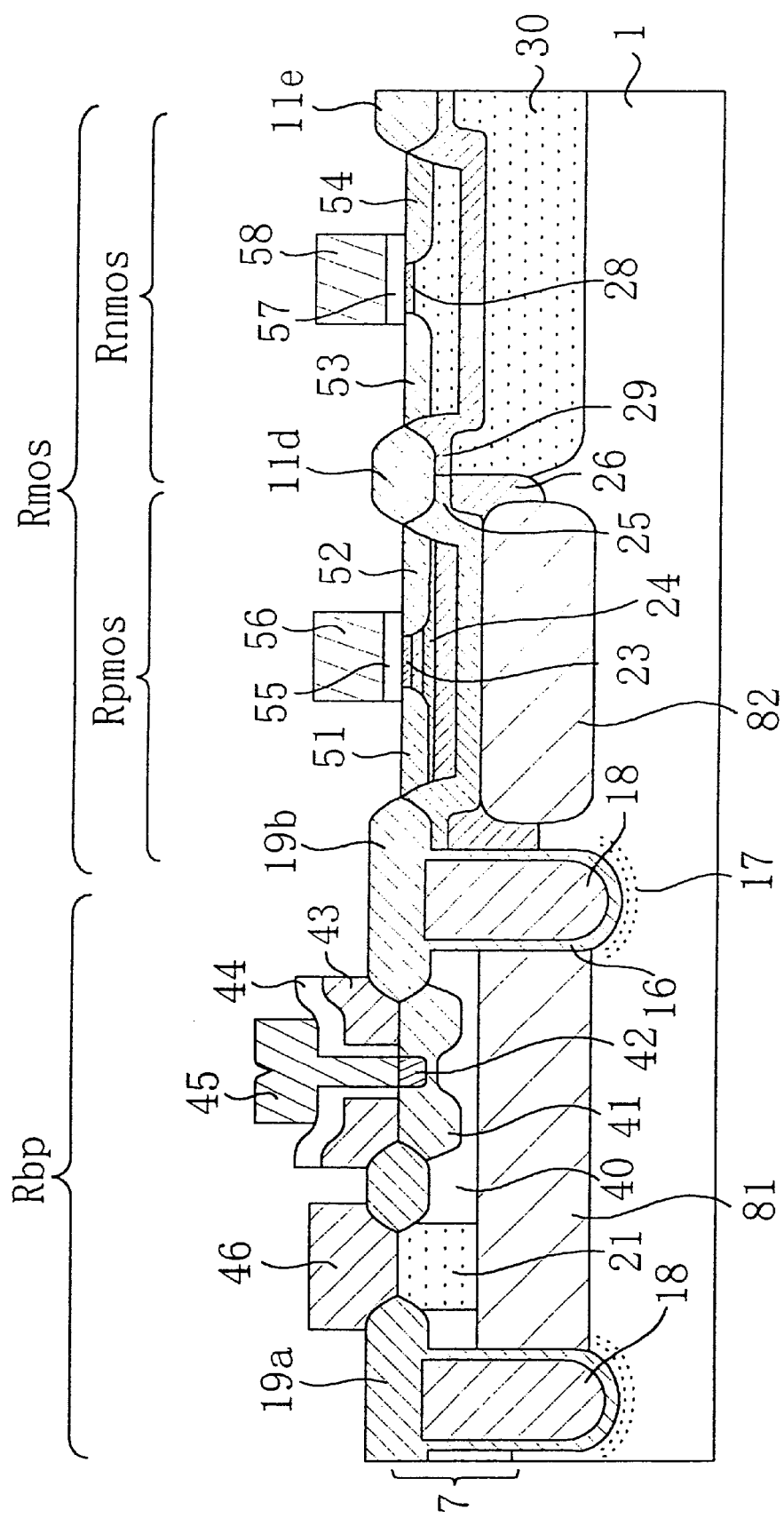
FIG. 11 is a sectional view for showing completion of the formation of main parts of respective transistors by the method of manufacturing a semiconductor device of the first embodiment.

The manufacturing procedures thereafter are not herein described and shown in detail. Ultimately, as is shown in FIG. 11, the bipolar transistor includes a collector diffusion layer 40 formed through the epitaxial growth, a base diffusion layer 41 formed in the collector diffusion layer 40 between the isolation oxide film 11b and the cap oxide film 19b, an emitter diffusion layer 42 surrounded with the base diffusion layer 41, a base electrode 43 in contact with the base diffusion layer 41, an emitter electrode 45 in contact with the emitter diffusion layer 42, an interelectrode insulating film 44 disposed between the base electrode 43 and the emitter electrode 45, and a collector electrode 46 in contact with the collector wall 21.

Also, the PMOSFET includes a p-type source diffusion layer 51, a p-type drain diffusion layer 52, a gate oxide film 55 and a gate electrode 56. The NMOSFET includes an n-type source diffusion layer 53, an n-type drain diffusion layer 54, a gate oxide film 57 and a gate electrode 58.

In the manufacturing method of this embodiment, the n-type well layer 26 and the p-type well layer 30 are formed not through diffusion by a heat treatment but through the high energy ion implantation. Specifically, the well layer is not formed through diffusion of an impurity by a heat treatment conducted after forming a surface diffusion layer as in the conventional method of manufacturing a semiconductor device. Since the present method adopts the high energy ion implantation, an impurity can be allowed to exist in a desired range reaching the depths of the semiconductor substrate from the initial stage of the ion implantation, and hence, there is no need to diffuse the impurity by a heat treatment conducted at a high temperature for a long period of time. Accordingly, the heat treatment for activation can be conducted at a low temperature in a very short period of time, and the n-type buried layer 81 in the bipolar transistor forming region Rbp can be prevented from being enlarged in its depth. As a result, the depth of the trench 15 penetrating the n-type buried layer 81 in the bipolar transistor forming region Rbp can be made as small as approximately 3 μm, which is 5 through 6 μm in the conventional method. This leads to the following effects:

First, a time required for the procedure for forming the trench can be shortened. Specifically, a bipolar transistor with a good high frequency characteristic can be formed on the common p-type silicon substrate 1 together with a highly integrated MOS transistor under practicable conditions.

Figure 23:
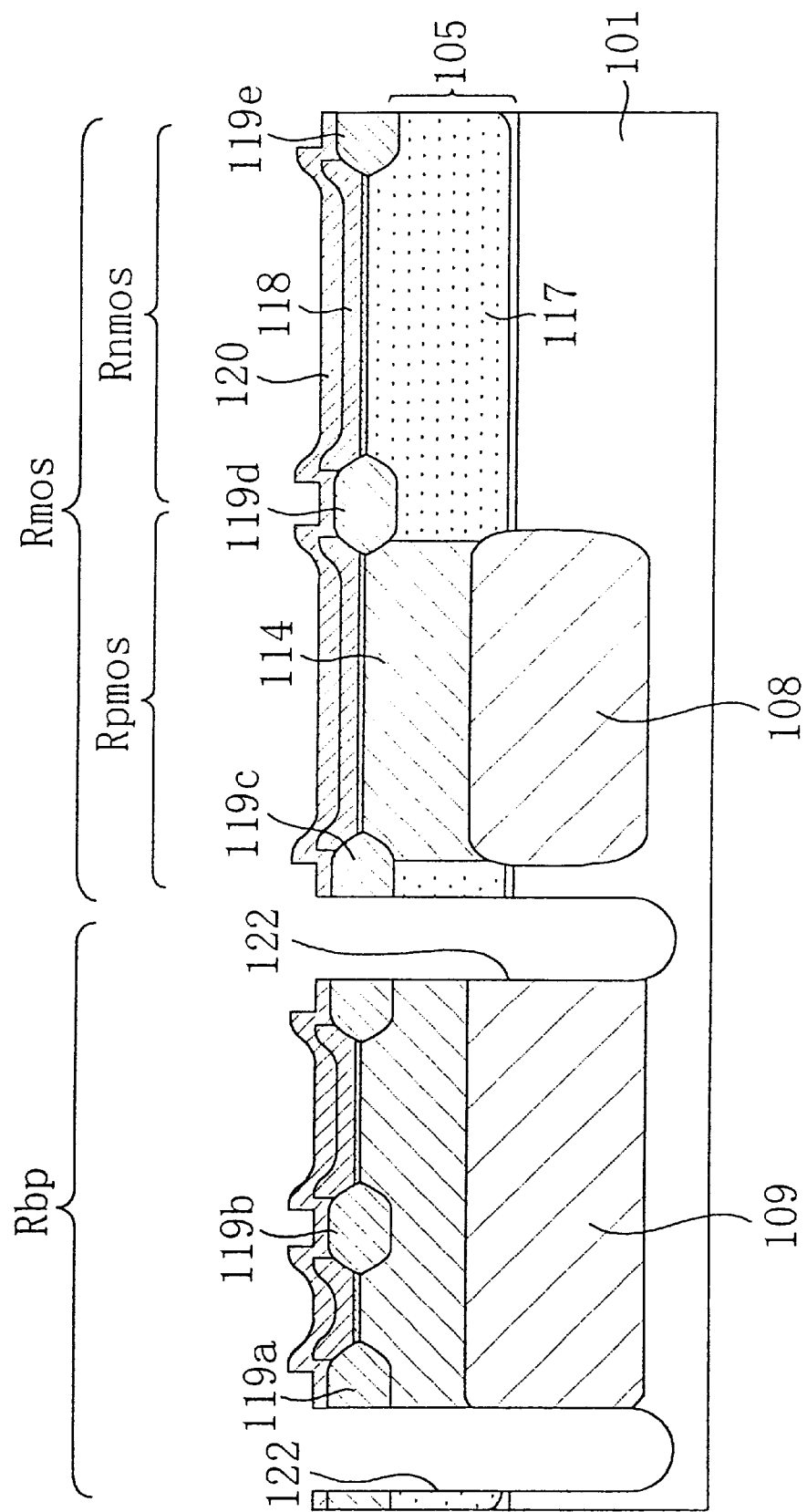
FIG. 23 is a sectional view for showing a procedure for forming a trench in the conventional method of manufacturing a semiconductor device.
Figure 24:
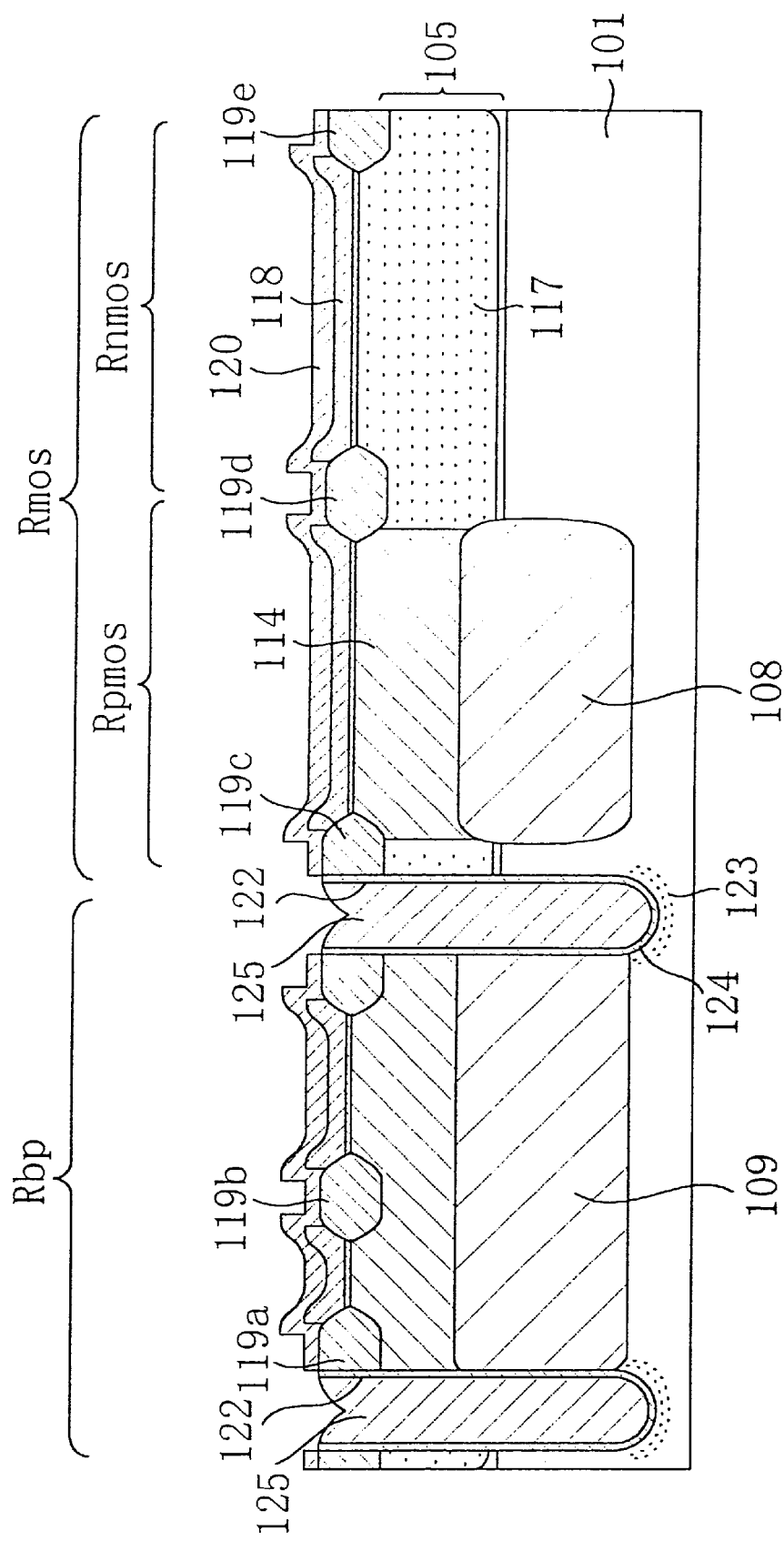
FIG. 24 is a sectional view for showing a procedure for forming a buried polysilicon layer in the trench in the conventional method of manufacturing a semiconductor device.

Secondly, since a nitride film can be used as a mask for forming the trench, the LOCOS isolation function in the MOS transistor forming region Rmos can be prevented from degrading. In the conventional method, the trench is formed by using the silicon oxide film 120 formed on the LOCOS forming silicon nitride film 118 as a mask as is shown in FIG. 23. This is for the purpose of retaining high etch selectivity to the silicon substrate. However, in removing the silicon oxide film 120 in the following procedure, the isolation oxide films 119b, 119d and 119e, that is, the LOCOS films below, are also partially removed, resulting in disadvantageously degrading the isolation function in the MOS transistor forming region Rmos. In contrast, according to the manufacturing method of this embodiment, the trench 15 can be made shallow as described above, and hence, the time required for forming the trench is not long. Accordingly, any material that has given etch selectivity to the silicon substrate not as small as that of the silicon oxide film can be used as a masking film. Specifically, the selectivity between the second silicon nitride film 12 and the isolation oxide films 11b, 11d and 11e below the second silicon nitride film 12 can be retained high, and therefore, the isolation oxide films 11b, 11d and 11e, that is, the LOCOS films, can be advantageously definitely prevented from being too thin to lose the isolation function.

Furthermore, since the second silicon nitride film 12 is allowed to remain as is shown in FIG. 3, merely the upper portion of the buried polysilicon layer 18 can be easily selectively oxidized. Thus, the formation of the cap oxide films 19a and 19b can be eased. In other words, the second silicon nitride film 12 can be used not only as the mask for forming the trench but also as the mask for the thermal oxidation.

Thirdly, since the etching time for forming the trench is thus short and the second silicon nitride film 12 is less removed, in the impurity implantation for forming the channel stopper layer 17, the channel stopper layer 17 can be formed in a self-alignment manner without forming an additional mask. In other words, even when the impurity is implanted into the entire surface without using an additional mask, the impurity for forming the channel stopper layer can be prevented from being introduced into the MOS transistor forming region Rmos.

Each of the MOS transistors shown in FIG. 11 can be a MOS transistor of the so-called LDD structure including sidewalls formed on the side faces of the gate electrode 56 or 58 and a low concentration source diffusion layer and a low concentration drain diffusion layer formed below the sidewalls. In this case, the MOS transistor can attain further refinement because a short channel effect can be suppressed.

Furthermore, the bipolar transistor of this embodiment is an NPN bipolar transistor, which does not limit the invention, and can be a PNP bipolar transistor. However, since the NPN bipolar transistor using electrons as a majority carrier has a high operation speed, the NPN bipolar transistor is more suitable for attaining a high frequency characteristic.

The N-type buried diffusion layers 81 and 82 and the regions above these layers are formed through the epitaxial growth in this embodiment, which does not limit the invention. The buried diffusion layers 81 and 82 can be formed by ion implantation or the like. Also, the N-type buried diffusion layer 82 in the MOS transistor forming region Rmos is not indispensable.

It goes without saying that the types of processes and the conditions such as a dose and an implantation energy adopted for forming the respective regions in the bipolar transistor and the MOS transistors are not limited to those described in this embodiment.

Embodiment 2

Figure 12:
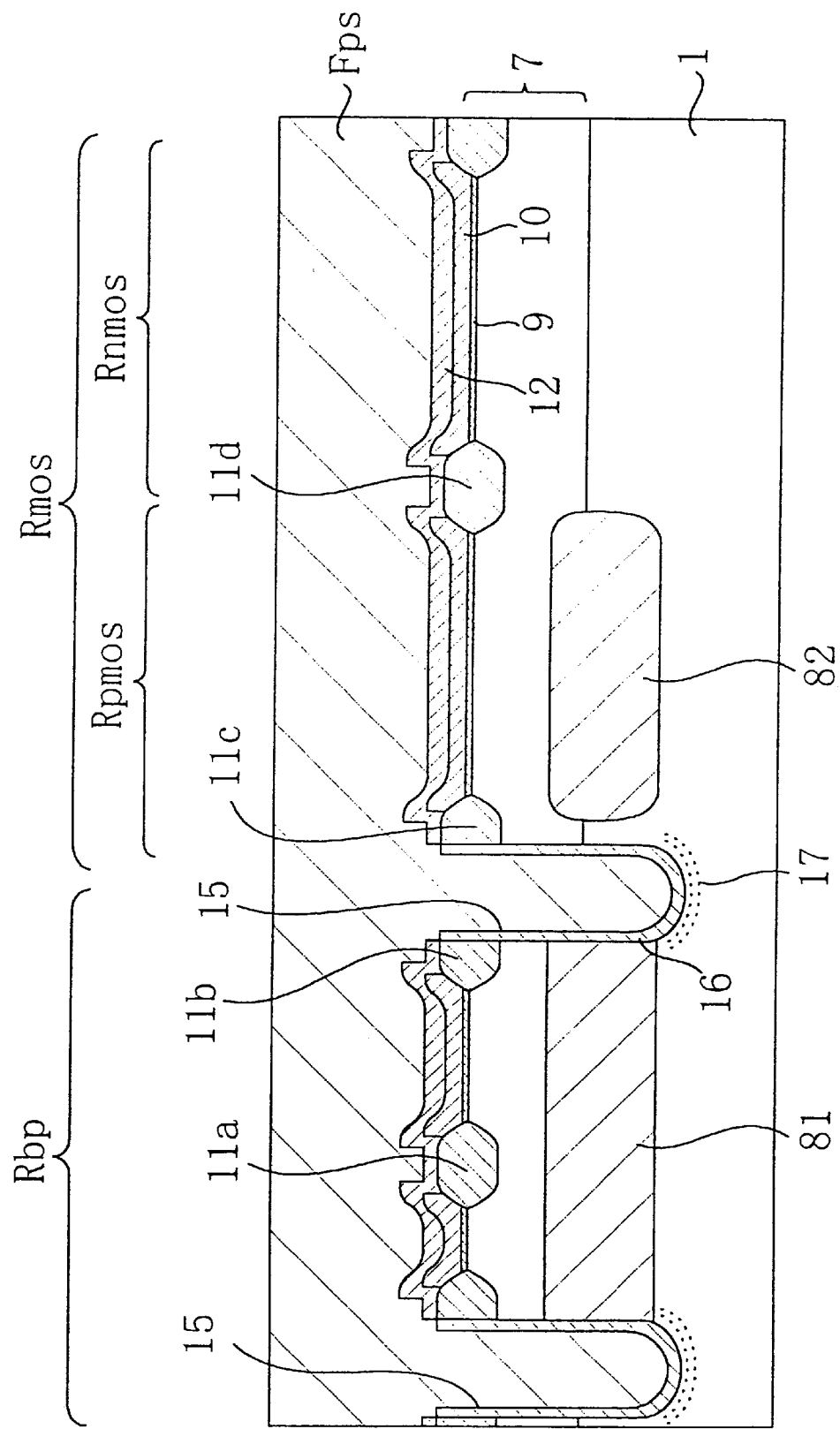
FIG. 12 is a sectional view for showing a procedure for depositing a polysilicon film used for forming a buried polysilicon layer in a method of manufacturing a semiconductor device according to a second embodiment of the invention.
Figure 13:
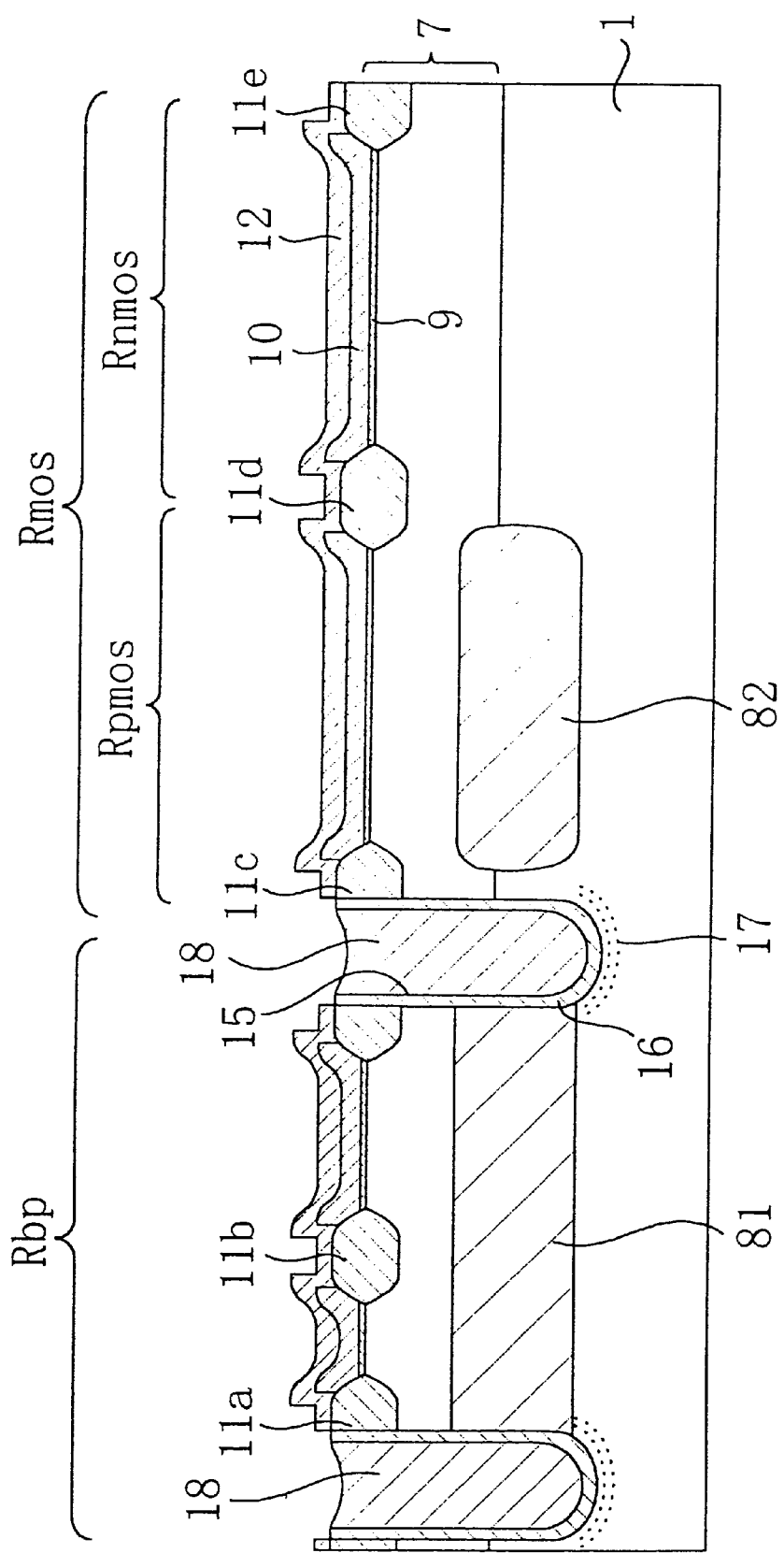
FIG. 13 is a sectional view for showing a procedure for forming the buried polysilicon layer in a trench through etch back in the method of manufacturing a semiconductor device of the second embodiment.

FIGS. 12 and 13 are sectional views for showing characteristic procedures in a method of manufacturing a semiconductor device according to a second embodiment. Also in this embodiment, prior to the procedure shown in FIG. 12, the same procedures as those described in the first embodiment shown in FIGS. 1 through 4 are conducted.

Specifically, by using a mask oxide film formed on a main surface of a p-type silicon substrate 1, deep ion implanted layers are respectively formed in a bipolar transistor forming region Rbp and a MOS transistor forming region Rmos. Furthermore, an n-type epitaxial layer 7 is grown on the entire main surface of the p-type silicon substrate 1, and arsenic is partially diffused from the deep ion implanted layers also into the epitaxial layer 7, thereby forming N-type buried layers 81 and 82 each with a large depth and a large width. Next, after successively forming a silicon oxide film 9 and a first silicon nitride film 10 on the epitaxial layer 7, isolation oxide films 11a through 11e are formed in predetermined isolation regions by the general LOCOS method. Then, after forming a second silicon nitride film 12 as a masking film on the substrate, the isolation oxide films 11a and 11c and the substantially center portions of the second silicon nitride film 12 above these oxide films are selectively removed, thereby forming trench openings 13. Then, the silicon substrate exposed in each trench opening 13 is etched, thereby forming a trench 15 for isolation. Thereafter, a channel stopper layer 17 and a trench sidewall oxide film 16 are formed.

Figure 14:
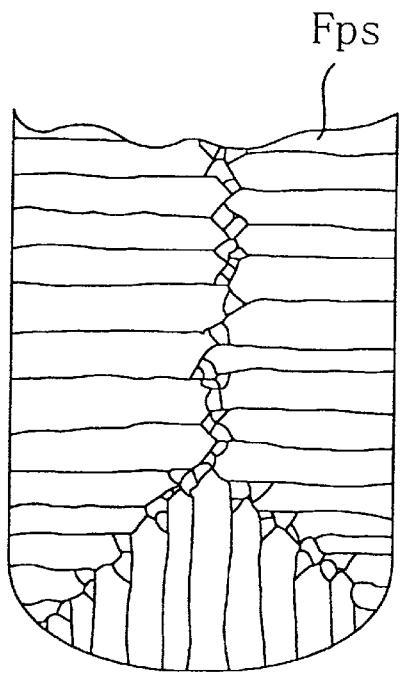
FIG. 14 is a schematic sectional view of the crystalline structure of polysilicon within the trench after forming the polysilicon film used for forming the buried polysilicon layer in the method of manufacturing a semiconductor device of the second embodiment.

Next, in the procedure shown in FIG. 12, a polysilicon film Fps to be used as a buried film with polycrystal structure is deposited on the substrate. As is shown in FIG. 14, pillar-shaped crystal grains are grown in the trench 15 in a direction perpendicular to the wall of the trench 15, and hence, the tips of the pillar-shaped crystal grains are gathered at the center of the trench, where a large number of defects gather.

Figure 15:
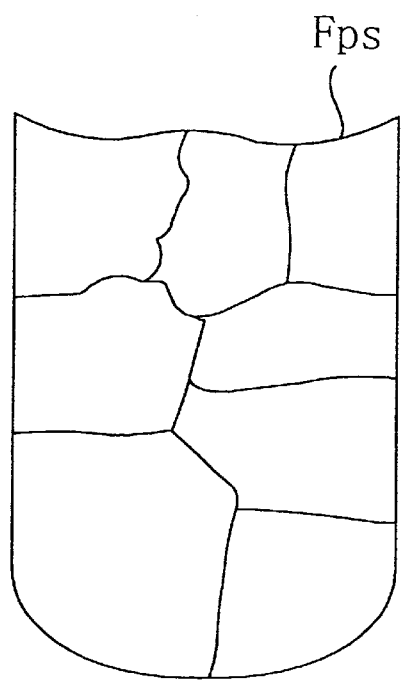
FIG. 15 is a schematic sectional view of the crystalline structure of polysilicon within the trench after annealing the polysilicon film used for forming the buried polysilicon layer in the method of manufacturing a semiconductor device of the second embodiment.
Figure 16:
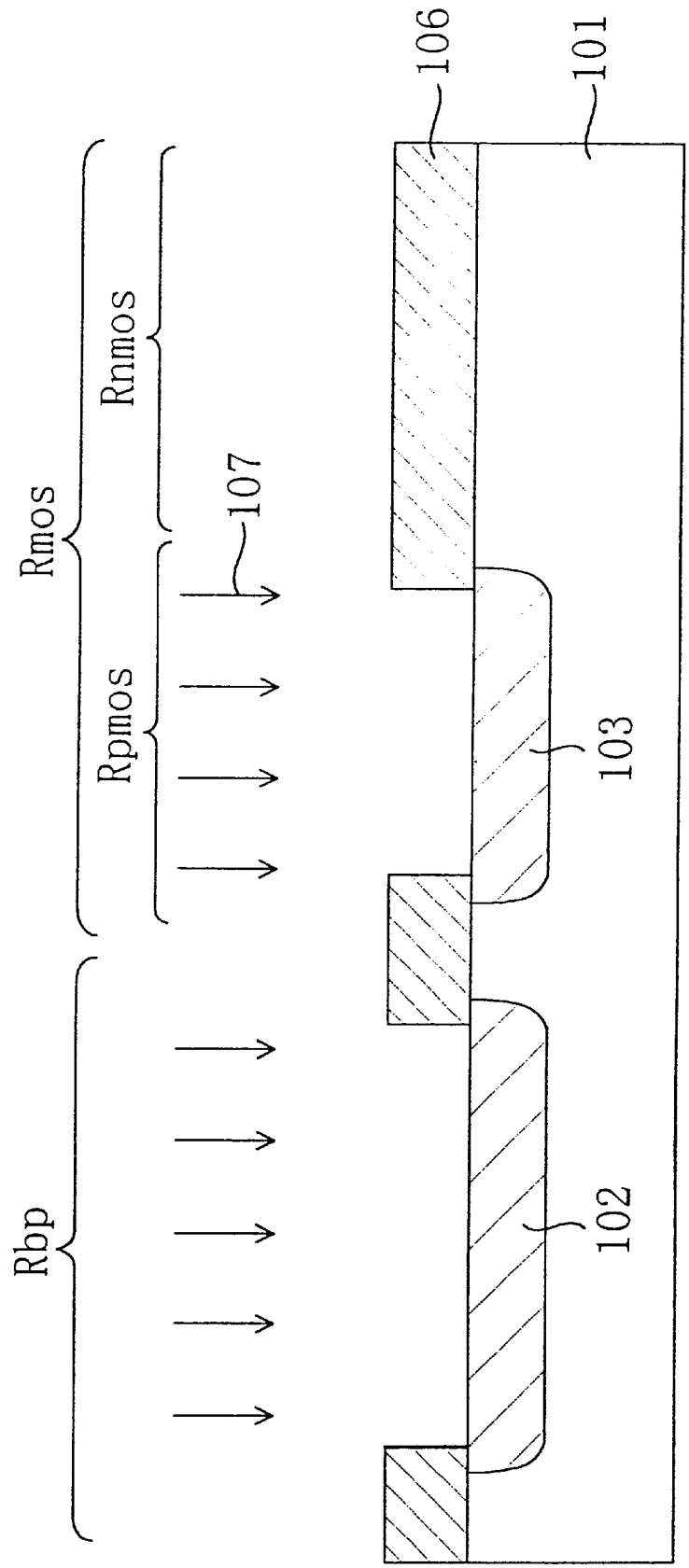
FIG. 16 is a sectional view for showing a procedure for forming a deep ion implanted layer in a conventional method of manufacturing a semiconductor device.
Figure 17:
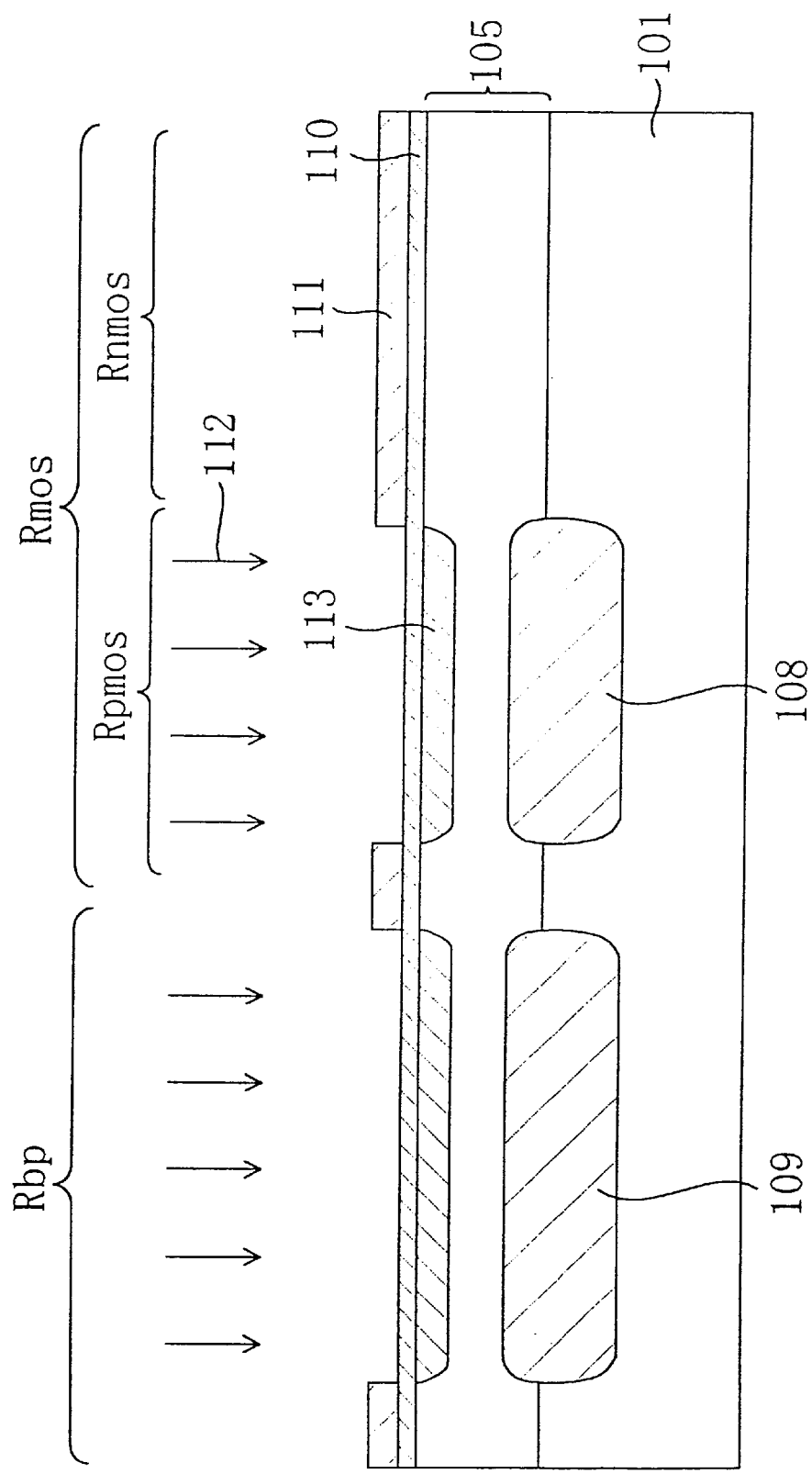
FIG. 17 is a sectional view for showing a procedure for forming an n-type buried layer and a surface diffusion layer in the conventional method of manufacturing a semiconductor device.
Figure 18:
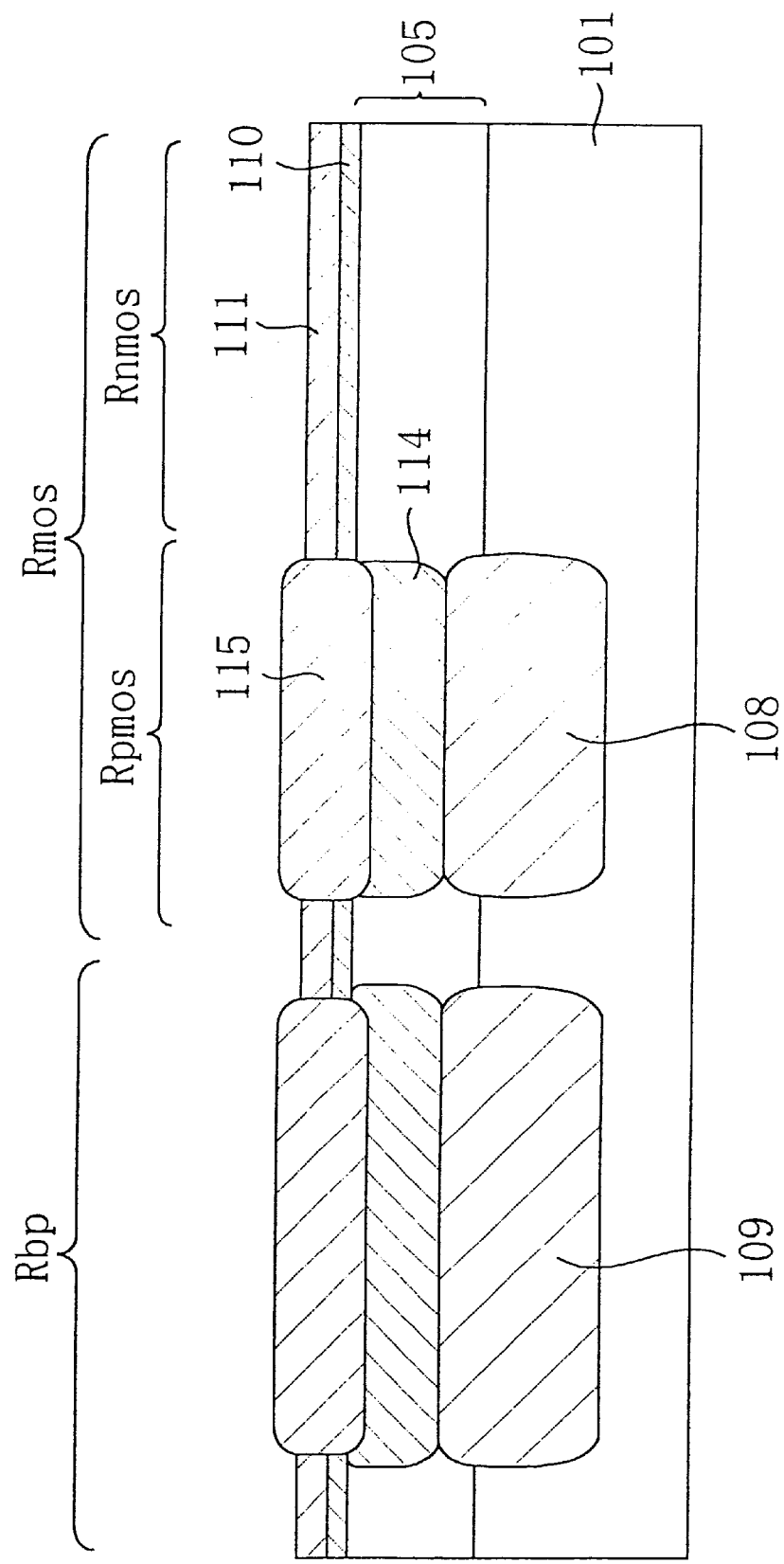
FIG. 18 is a sectional view for showing a procedure for forming a mask oxide film in the conventional method of manufacturing a semiconductor device.
Figure 19:
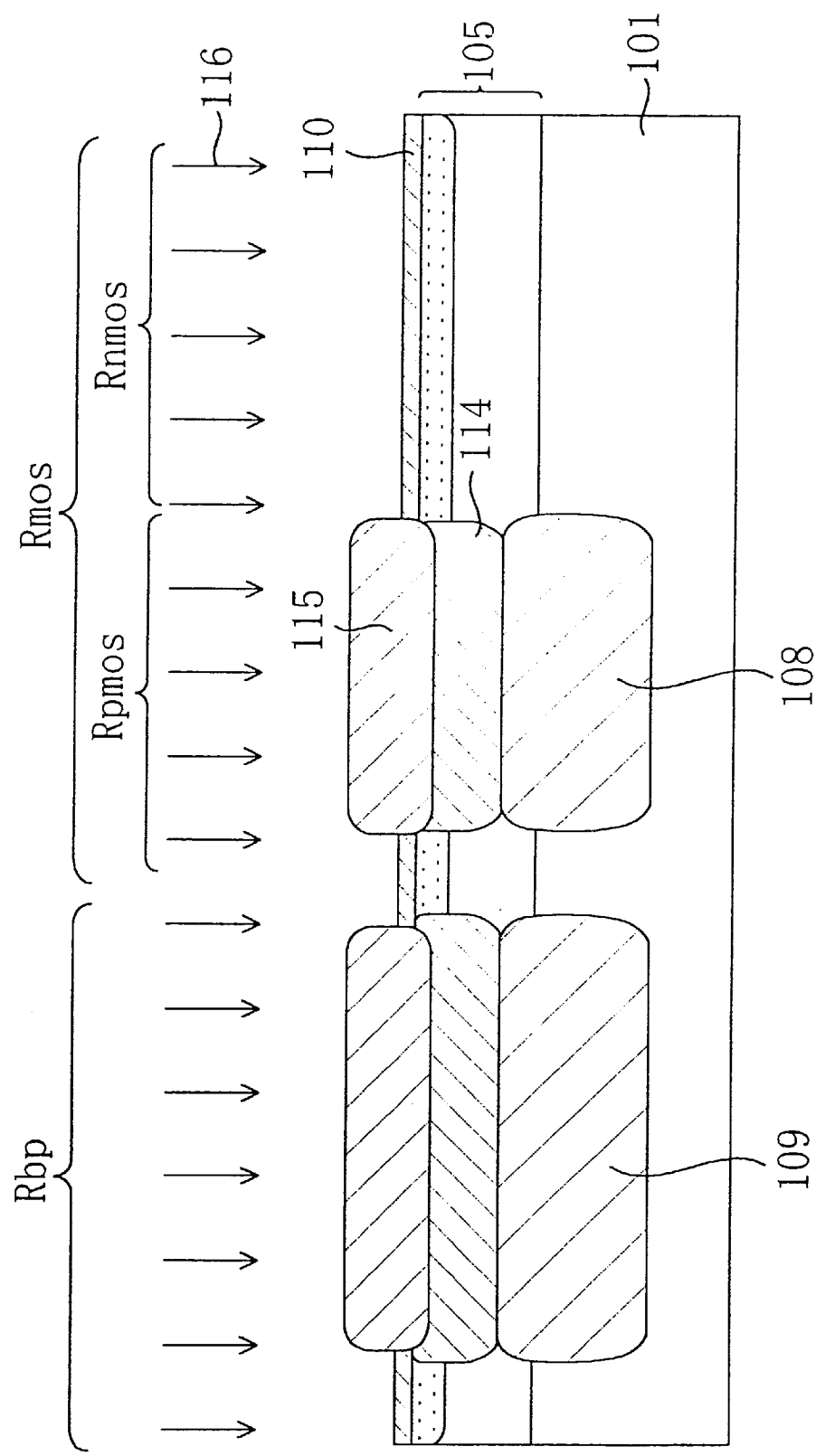
FIG. 19 is a sectional view for showing a procedure for forming a p-type implanted layer to be used for a p-type well region in the conventional method of manufacturing a semiconductor device.
Figure 20:
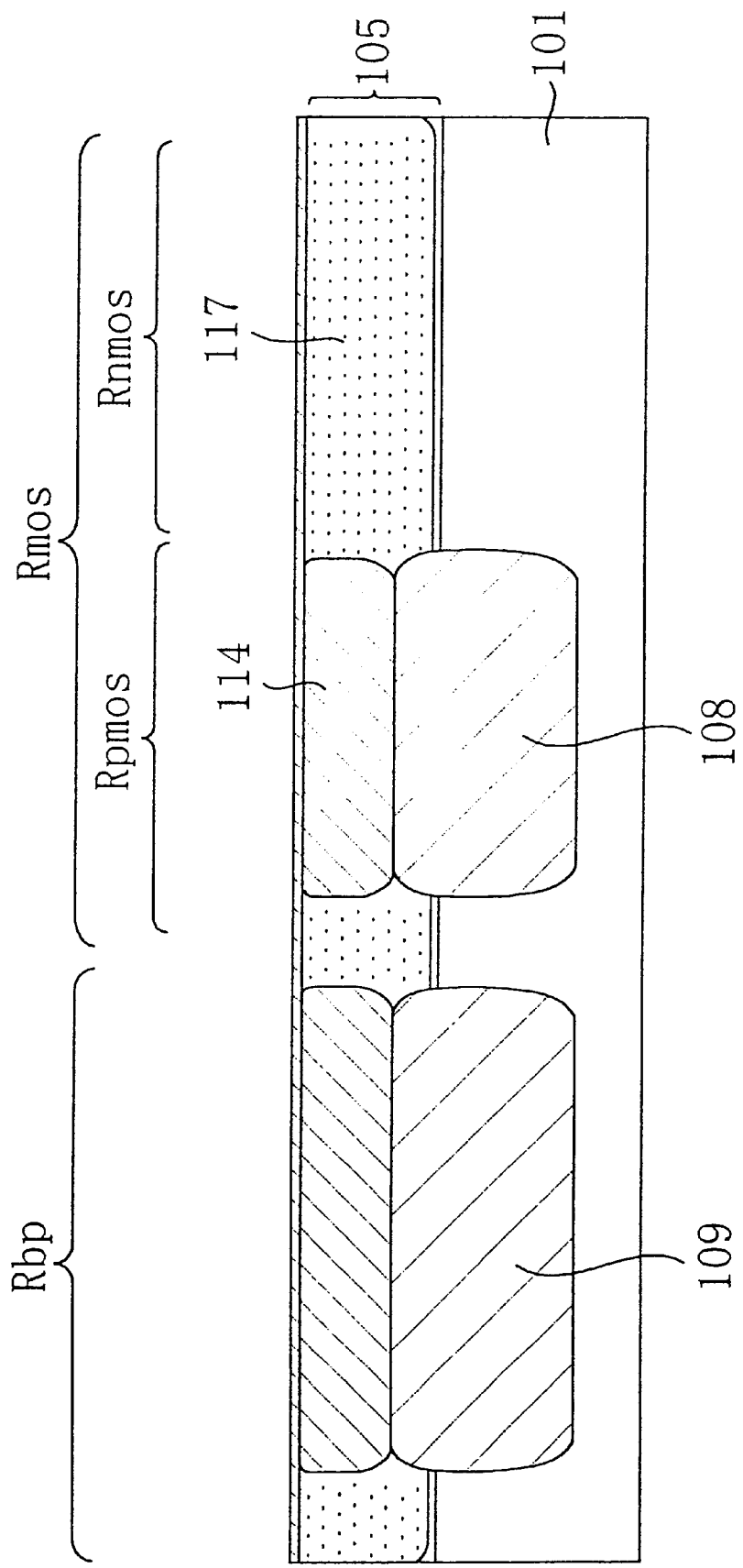
FIG. 20 is a sectional view for showing a procedure for forming the p-type well region in the conventional method of manufacturing a semiconductor device.
Figure 21:
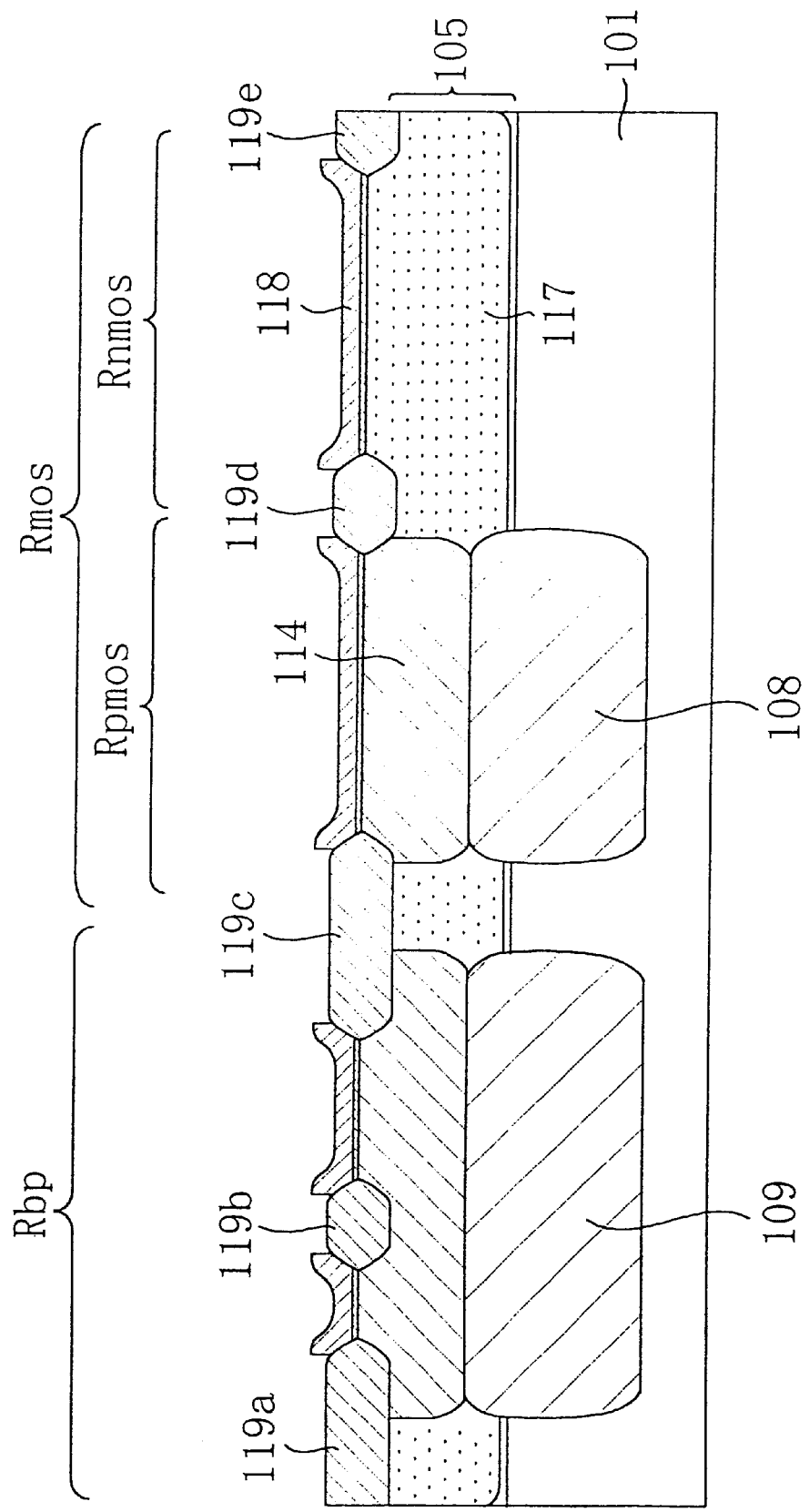
FIG. 21 is a sectional view for showing a procedure for forming an isolation oxide film in the conventional method of manufacturing a semiconductor device.
Figure 22:
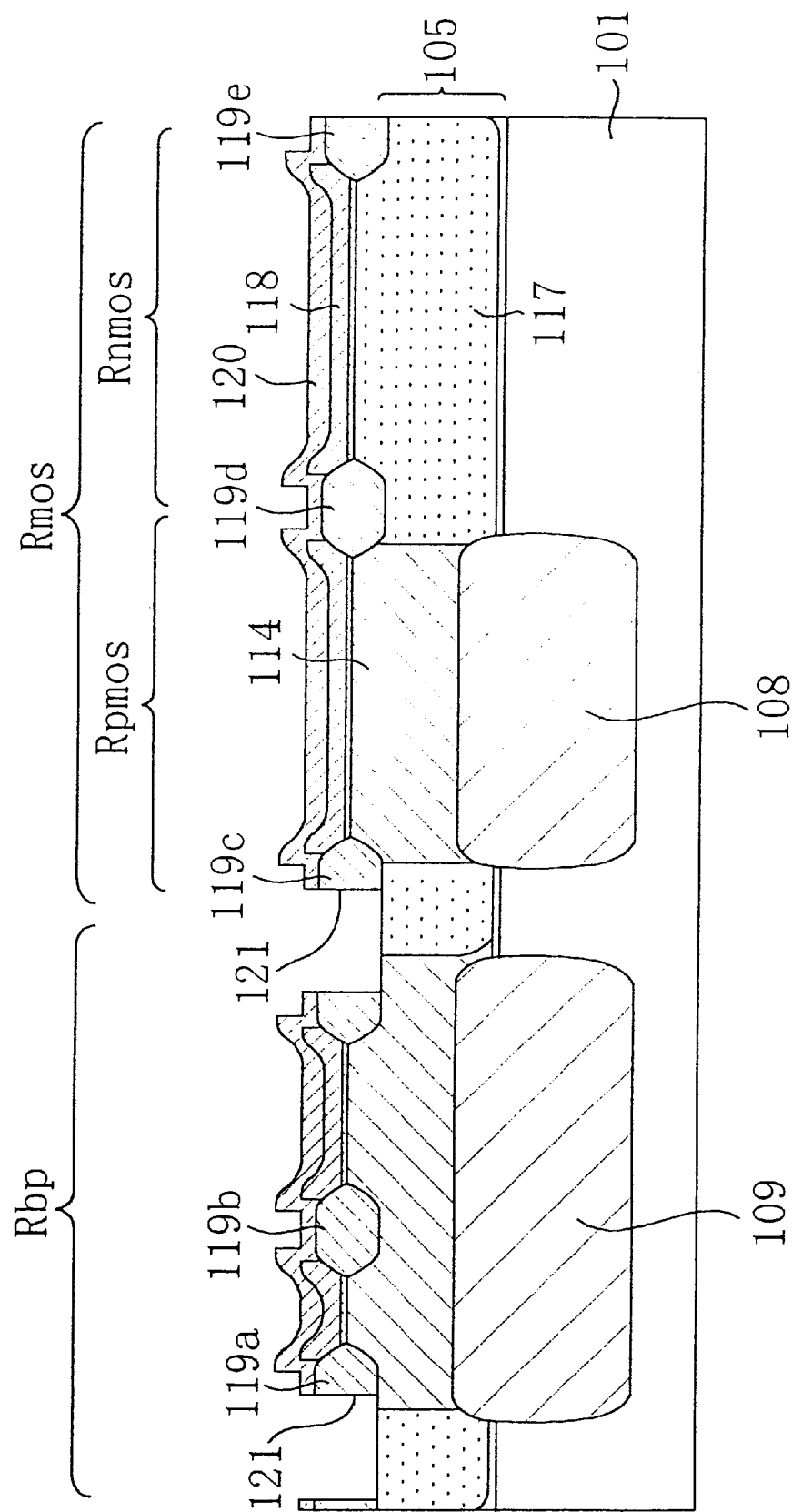
FIG. 22 is a sectional view for showing a procedure for forming a mask oxide film and a trench opening in the conventional method of manufacturing a semiconductor device.

At this point, as a characteristic of the method of manufacturing a semiconductor device of this embodiment, with the polysilicon film Fps deposited, annealing is conducted, for example, at a temperature of approximately 900° C. for approximately 30 minutes. Through this annealing, the crystal grains are rearranged as is shown in FIG. 15, so that the polysilicon can be changed from the structure where the pillar-shaped crystal grains are gathered to a structure where crystal grains in indeterminate shapes are gathered.

Then, in the procedure shown in FIG. 13, by using the second silicon nitride film 12 as an etching stopper film, a buried polysilicon layer 18 is formed in the trench 15 through the etch back by the dry etching.

In this embodiment, since the polysilicon in the trench 15 has the structure where the crystal grains in indeterminate shapes are gathered, the etch rate on the plane can be made uniform. As a result, on the top surface of the buried polysilicon layer 18, not a V groove but a recess with a comparatively gentle inclination is formed.

The procedures thereafter are not shown, but the same procedures as those described in the first embodiment shown in FIGS. 6 through 11 are conducted. Ultimately, a semiconductor device having the same structure as that of the first embodiment shown in FIG. 11 can be obtained.

Specifically, the bipolar transistor includes a collector diffusion layer 40 formed through the epitaxial growth, a base diffusion layer 41 formed in the collector diffusion layer 40 between the isolation oxide film 11b and the cap oxide film 19b, an emitter diffusion layer 42 surrounded with the base diffusion layer 41, a base electrode 43 in contact with the base diffusion layer 41, an emitter electrode 45 in contact with the emitter diffusion layer 42, an interelectrode insulating film 44 disposed between the base electrode 43 and the emitter electrode 45, and a collector electrode 46 in contact with a collector wall 21.

Also, the PMOSFET includes a p-type source diffusion layer 51, a p-type drain diffusion layer 52, a gate oxide film 55 and a gate electrode 56. The NMOSFET includes an n-type source diffusion layer 53, an n-type drain diffusion layer 54, a gate oxide film 57 and a gate electrode 58.

In the manufacturing method of this embodiment, since the annealing is conducted with the polysilicon film Fps deposited in the procedure shown in FIG. 12, the structure of the polysilicon is changed through this annealing from the gathering of the pillar-shaped crystal grains to the gathering of the crystal grains in indeterminate shapes as is shown in FIG. 15. As a result, the distribution of defects such as a grain boundary can be made substantially uniform. Accordingly, in forming the buried polysilicon layer 18 in the trench 15 through the etch back by the dry etching in the procedure shown in FIG. 13, the etch rate is made uniform on the plane. Thus, the formation of the V groove on the top surface of the buried polysilicon layer 18 can be definitely avoided. Accordingly, without additionally conducting another burying procedure or an oxide film burying procedure, it is possible to obtain a Bi-CMOS device with high reliability in which a line is not broken and a bridge is not formed in subsequent procedures.

In particular, the heat treatment is conducted at a temperature lower than 1000° C. (at 900° C. in this embodiment) before the etch back of the buried polysilicon layer 18. Therefore, it is possible to suppress degradation in the breakdown voltage and increase of a capacitance component otherwise caused when the channel stopper layer 17 formed through the impurity implantation at the bottom of the trench and the n-type buried layers 81 and 82 are spread to mutually interfere. In other words, without spoiling the effect attained due to the shallow trench, the structure of the buried polysilicon layer 18 can be improved.

Specifically, the annealing after depositing the polysilicon film is conducted preferably at a temperature exceeding a growth temperature of the buried insulating material but lower than 1000° C. Under this condition, the aforementioned problems can be avoided while rearranging the crystal grains of the polysilicon within the trench.

Figure 25A:
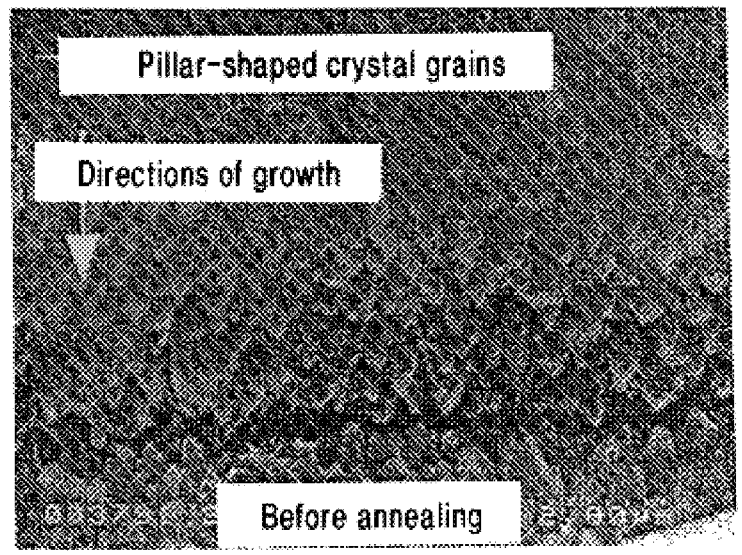
FIGS. 25(a) and 25(b) are photocopies of microphotographs of the crystalline structures of the buried polysilicon layers formed by the conventional method and the present method, respectively.
Figure 25B:
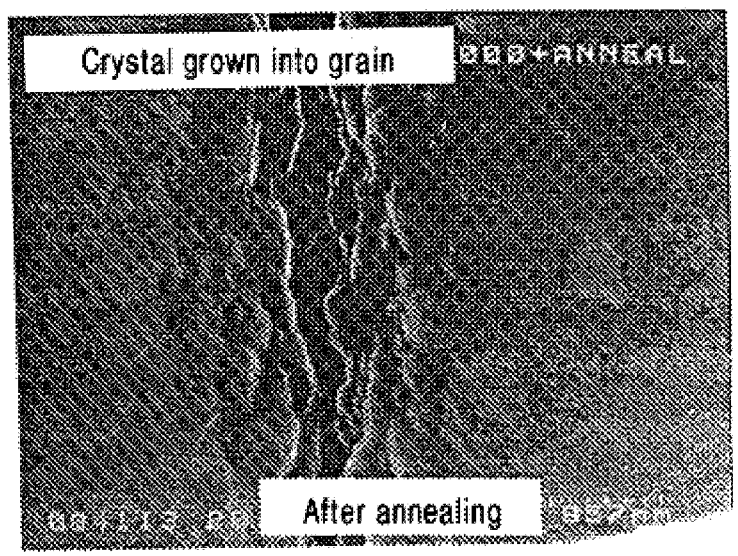

FIGS. 25(a) and 25(b) are photocopies of microphotographs of the crystalline structures of the buried polysilicon layers formed by the conventional method and the present method, respectively. As is shown in FIG. 25(a), in the buried polysilicon layer formed by the conventional method, a large number of fine pillar-shaped crystal grains extending in the crosswise direction of the trench are observed to abut against one another at the center. In contrast, in the buried polysilicon layer formed by the present method shown in FIG. 25(b), the pillar-shaped crystal grains are observed to have grown into large crystal grains in indeterminate shapes.

Figure 26A:
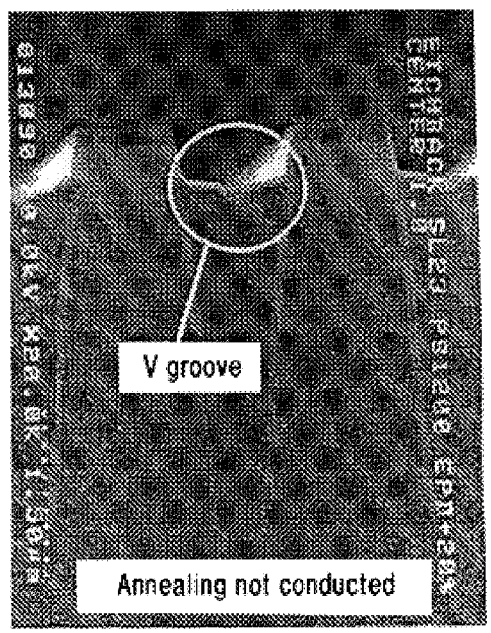
FIGS. 26(a) and 26(b) are photocopies of microphotographs of the sections of the buried polysilicon layers formed by the conventional method and the present method, respectively.
Figure 26B:
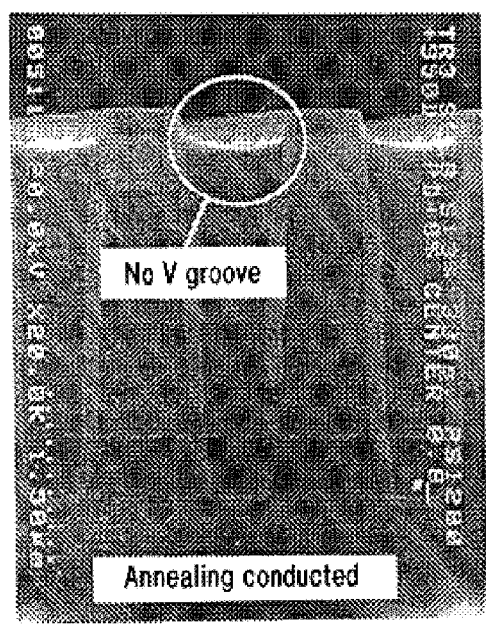

FIGS. 26(a) and 26(b) are photocopies of microphotographs of the sections of the buried polysilicon layers formed by the conventional method and the present method, respectively. As is shown in FIG. 26(a), a V groove is formed on the top surface of the buried polysilicon layer formed by the conventional method. In contrast, in the buried polysilicon layer formed by the present method shown in FIG. 26(b), no V groove is formed on the top surface thereof and the top surface of the entire substrate is in a smooth shape.

Also in this embodiment, each of the MOS transistors can be a MOS transistor of the so-called LDD structure including sidewalls on the side faces of the gate electrode 56 or 58 and a low concentration source diffusion layer and a low concentration drain diffusion layer formed below the sidewalls. In this case, the MOS transistor can attain further refinement because the short channel effect is suppressed.

Furthermore, the description is given on the Bi-CMOS device including the bipolar transistor and the MOS transistors formed on the common semiconductor substrate in this embodiment, which does not limit the invention. The invention is applicable to any of general MOS transistors and bipolar transistors. Also, the invention is applicable not only to transistors but also to, for example, a trench-type capacitance device element formed by burying a trench with polysilicon.

Moreover, when the invention is applied to a Bi-CMOS device, the bipolar transistor is not limited to an NPN bipolar transistor but can be a PNP bipolar transistor. However, the NPN bipolar transistor is more suitable for attaining a high frequency characteristic because it uses electrons as a majority carrier and hence has a higher operation speed.

It goes without saying that the types of processes and the conditions such as a dose and an implantation energy adopted for forming the respective regions in the bipolar transistor and the MOS transistors are not limited to those described in this embodiment.

What is claimed is:

1. A method of manufacturing a semi-conductor device comprising a bipolar transistor operated with a carrier of a first conductivity type used as a majority carrier and a MOS transistor operated with a carrier of a second conductivity type used as a majority carrier, wherein said semiconductor device further comprises:
   a first step of forming a first impurity implanted layer of the first conductivity type forming a first buried layer in a bipolar transistor forming region on a main surface of a semiconductor substrate of the second conductivity type and forming a second impurity implanted layer of the first conductivity type forming a second buried layer in a MOS transistor forming region, said second impurity implanted layer being separated from said first impurity implanted layer, and then, forming an epitaxial growth layer of the first conductivity type on said semiconductor substrate under a condition that said first and second buried layers are not in contact with each other;
   a second step of forming, in a boundary between said bipolar transistor forming region and said MOS transistor forming region, a trench having a depth larger than a lower end of said first buried layer of the first conductivity type formed in said bipolar transistor forming region;
   a third step of burying said trench with a buried film for insulating;
   a fourth step of forming a well layer of the first conductivity type by implanting, at high energy, an impurity of the first conductivity type into a region including at least said epitaxial growth layer in said MOS transistor forming region after said third step has been performed;
   a fifth step of forming a gate electrode, a gate insulating film and source/drain diffusion layers in said MOS transistor forming region; and
   a sixth step of forming an emitter diffusion layer, a base diffusion layer and a collector diffusion layer in said bipolar transistor forming region.

2. The method of manufacturing a semiconductor device of claim 1, further comprising, prior to said second step:
   a step of forming, in the boundary between said bipolar transistor forming region and said MOS transistor forming region, an isolation insulating film;
   a step of forming, on a substrate, a masking film with high etch selectivity to said isolation insulating film and said semiconductor substrate; and
   a step of forming an opening, including an area above an end of said first buried layer of the first conductivity type formed in said bipolar transistor forming region, in said masking film and said isolation insulating film directly below said masking film,
   wherein, in said second step, said trench is formed by digging a region below said opening in said epitaxial growth layer and said semiconductor substrate.

3. The method of manufacturing a semiconductor device of claim 2,
   wherein said isolation insulating film is a silicon oxide film, and
   in said second step, said trench is formed by using a silicon nitride film as a mask.

4. A method of manufacturing a semiconductor device of claim 1,
   wherein the first conductivity type is an n-type and the second conductivity type is a p-type.

5. A method of manufacturing a semiconductor device comprising:
   a first step of forming a trench on a main surface of a semiconductor substrate;
   a second step of depositing a buried film of polycrystal including plural crystal grains on the entire surface of said semiconductor substrate after said first step has been performed;
   a third step of conducting a heat treatment for changing said crystal grains of said buried film into large crystal grains with said buried film deposited on the entire surface of said semiconductor substrate after said second step has been performed; and
   a fourth step of allowing said buried film to remain in said trench by etching back said buried film after said third step has been performed.

6. The method of manufacturing a semiconductor device of claim 5,
   wherein said buried film is a polysilicon film.

7. As The method of manufacturing a semiconductor device of claim 5,
   wherein said heat treatment conducted on said buried film is performed at a temperature exceeding a growth temperature of a material of said buried film but lower than 1000° C.

8. The method of manufacturing a semiconductor device of claim 1, wherein, in said fourth step, said impurity of the first conductivity type is implanted at high energy so as to form said well layer of the first conductivity type in a region extending from a portion below a threshold control layer to a portion below a channel stopper layer and higher than a lower end of said second buried layer.

9. The method of manufacturing a semiconductor device of claim 1, wherein, in said third step, after a polycrystal film for burying said trench is formed on the entire surface of said semiconductor substrate, a heat treatment for changing crystal grains of said polycrystal film into large crystal grains is conducted, thereby burying said trench with said polycrystal film as a part of said buried film for insulating by etching back said polycrystal film.

10. The method of manufacturing a semiconductor device of claim 9, wherein said buried film is a polysilicon film.

11. The method of manufacturing a semiconductor device of claim 9, wherein said heat treatment conducted on said buried film is performed at a temperature exceeding a growth temperature of a material of said buried film but lower than 1000° C.

12. The method of manufacturing a semiconductor device of claim 1, wherein said third step further comprises the steps of:

a) depositing a buried film of polycrystal including plural crystal grains on the entire surface of said semiconductor substrate; and b) conducting a heat treatment for changing said crystal grains of said buried film into large crystal grains with said buried film deposited on the entire surface of said semiconductor substrate after said second step has been performed; and c) burying said trench with said buried film for insulating made of said buried film by etching back said buried film.

13. The method of manufacturing a semiconductor device of claim 12, wherein said buried film is a polysilicon film.

14. The method of manufacturing a semiconductor device of claim 12, wherein said heat treatment conducted on said buried film is performed at a temperature exceeding a growth temperature of a material of said buried film but lower than 1000° C.

\* \* \* \* \*